United States Patent
Pokroy et al.

(10) Patent No.: US 10,246,768 B2
(45) Date of Patent: Apr. 2, 2019

(54) PROCESS FOR PREPARATION OF MICRON-SIZED SINGLE CURVED CRYSTALS OF METALS

(71) Applicant: Technion Research & Development Foundation Limited, Haifa (IL)

(72) Inventors: Boaz Pokroy, Haifa (IL); Maria Koifman Khristosov, Haifa (IL)

(73) Assignee: TECHNION RESEARCH & DEVELOPMENT FOUNDA, Haifa (IL)

( * ) Notice: Subject to any disclaimer, the term of this patent is extended or adjusted under 35 U.S.C. 154(b) by 462 days.

(21) Appl. No.: 14/675,829

(22) Filed: Apr. 1, 2015

(65) Prior Publication Data

US 2015/0284852 A1  Oct. 8, 2015

Related U.S. Application Data

(60) Provisional application No. 61/974,005, filed on Apr. 2, 2014.

(51) Int. Cl.
| | | |
|---|---|---|
| *C30B 1/02* | (2006.01) | |
| *C23C 14/18* | (2006.01) | |
| *C23F 1/00* | (2006.01) | |
| *C23F 1/40* | (2006.01) | |
| *C23C 14/58* | (2006.01) | |

(52) U.S. Cl.
CPC ......... *C23C 14/18* (2013.01); *C23C 14/5806* (2013.01); *C23C 14/5873* (2013.01); *C23F 1/00* (2013.01); *C23F 1/40* (2013.01); *Y10T 428/12014* (2015.01); *Y10T 428/25* (2015.01)

(58) Field of Classification Search
CPC .. C30B 1/00; C30B 1/02; C30B 1/026; C30B 1/04; C30B 1/10; C30B 21/00; C30B 21/02; C30B 25/00; C30B 25/02; C30B 25/10; C30B 25/16; C30B 25/18; C30B 25/186; C30B 29/00; C30B 29/02; C30B 29/10; C30B 29/52; C30B 29/60; C30B 29/66; C30B 33/00; C30B 33/02; C30B 33/08; C30B 33/10; C23C 14/18; C23C 14/5806;

(Continued)

(56) References Cited

U.S. PATENT DOCUMENTS 3,594,292 A * 7/1971 Russell et al. ..... B01D 39/2027
148/404
4,477,324 A * 10/1984 Cline .................. C25F 3/02
148/505

(Continued)

OTHER PUBLICATIONS

Adhikari et al; "Germanium Nanowire Epitaxy: Shape and Orientation Control" Nano Letters. vol. 6, No. 2, pp. 318-323 . (2006).

(Continued)

*Primary Examiner* — Kenneth A Bratland, Jr.
(74) *Attorney, Agent, or Firm* — The Roy Gross Law Firm, LLC; Roy Gross

(57) ABSTRACT

The present invention relates to metal micron-sized single crystals having a controlled curvature, which can be either fully or partially nanoporous; and to a process for growing of such single crystals from the confined volume of droplets of a eutectic composition melt comprising said metal as one of the two eutectic components, with no need of any fabrication steps.

12 Claims, 18 Drawing Sheets

(58) Field of Classification Search
CPC ...... C23F 1/00; C23F 1/40; Y10T 428/12014; Y10T 428/25
USPC ... 117/3–4, 7, 9, 84, 87–89, 94–95, 97, 102, 117/105–106, 902, 921, 928, 937–939
See application file for complete search history.

(56) References Cited

U.S. PATENT DOCUMENTS

| | | | | |
|---|---|---|---|---|
| 4,534,820 | A * | 8/1985 | Mori | C30B 11/12 117/58 |
| 2006/0182966 | A1* | 8/2006 | Lee | B82Y 30/00 428/375 |
| 2006/0249847 | A1* | 11/2006 | Eriksen | C23C 14/021 257/751 |
| 2013/0049150 | A1* | 2/2013 | Hong | H01L 31/035281 257/431 |

OTHER PUBLICATIONS

Aizenberg et al.; "Direct Fabrication of Large Micropatterned Single Crystals" Science 299, pp. 1205-1208. (2003).

Armstrong et al; "Emergence of physical properties mapped in a two-component system" arXiv preprint arXiv:1205.0488 (2012).

Audran et al; "Grayscale lithography process study applied to zero-gap microlenses for sub-2μm CMOS image sensors" Proc. of SPIE , 7639, pp. 763910-763911. (2010).

Barnard et al; "Equilibrium Morphology of Face-Centered Cubic Gold Nanoparticles >3 nm and the Shape Changes Induced by Temperature" J. Phys. Chem. B 109, pp. 24465-24472. (2005).

Biener et al; "Size Effects on the Mechanical Behavior of Nanoporous Au" Nano Letters, , 6(10), pp. 2379-2382. (2006).

Borukhin et al; "Formation and Elimination of Surface Nanodefects on Ultraflat Metal Surfaces Produced by Template Stripping" Langmuir 27, 1pp. 3415-13419. (2011).

Carey et al; "Formation of low-temperature self-organized nanoscale nickel metal islands" Nanotechnology 14, pp. 1223-1227 (2003).

Cheng et al; "Formation of a Cobalt Magnetic Dot Array via Block Copolymer Lithography" Adv. Mater. 13, pp. 1174-1178. (2001).

Cölfen; "Single Crystals with Complex Form via Amorphous Precursors"Angew. Chem., Int. Ed. 47, pp. 2351-2353. (2008).

Corso et al; "Electronic states in faceted Au(111) studied with curved crystal surfaces," Journal of Physics: Condensed Matter, 21, 353001. (2009).

De Vries; "Resistivity of thin Au films as a function of grain diameter and temperature" ournal of Physics F: Metal Physics 17(9), pp. 1945-1952. (1987).

Ding et al.; "Nanoporous gold leaf:"Ancient technology"/advanced material" Advanced Materials 16(21), pp. 1897-1900. (2004).

Dinsdale; "SGTE Data for Pure Elements" Calphad, 15(4), pp. 317-425. (1991).

Donnay and Pawson; "X-ray Diffraction Studies of Echinoderm Plates" Science 166(3909), pp. 1147-1150. (1969).

Eustathopoulos and Drevet; "Determination of the nature of metal-oxide interfacial interactions from sessile drop data" Materials Science and Engineering A249 pp. 176-183. (1998).

Fratzl et al; "A kinetic model of the transformation of a micropatterned amorphous precursor into a porous single crystal" Acta Biomaterialia 6 pp. 1001-1005. (2010).

Fritzsche and Taton; "Metal nanoparticles as labels for heterogeneous, chip-based DNA detectio" Nanotechnology 14 pp. R63-R73. (2003).

Gránásy; "Diffuse interface theory of nucleation" Journal of non-crystalline solids, 162(3), pp. 301-303. (1993).

Guan et al; "Pulsed laser dewetting of nickel catalyst for carbon nanofiber growth" Nanotechnology , 19, 235604. (2008).

Hodge et al; "Monolithic nanocrystalline Au fabricated by the compaction of nanoscale foam" Journal of materials research 20(3), pp. 554-557. (2005).

Karma; "Phase-field model of eutectic growth" Physical Review E 49(3), 2245. (1994).

Klemmer et al; "Combined reactions associated with L10 ordering" Journal of Magnetism and Magnetic Materials 266 pp. 79-87. (2003).

Kodambaka et al: "Germanium Nanowire Growth Below the Eutectic Temperature", Science , 316, pp. 729-732. (2007).

Koifman Khristosov et al; "Formation of Curved Micrometer-Sized Single Crystals," ACS nano , 8(5), pp. 4747-4753. (2014).

Kojima and Kato; "Nanoparticle formation in Au thin films by electron-beam-induced dewetting" Nanotechnology 19, 255605. (2008).

Kramer et al; "Surface-Stress Induced Macroscopic Bending of Nanoporous Gold Cantilevers" Nano Letters, 4(5), pp. 793-796. (2004).

Kurz and Trivedi; "Eutectic Growth under Rapid Solidification Conditions" Metallurgical Transactions A,, 22(12), pp. 3051-3057. (1991).

Lang et al; "Nanoporous metal/oxide hybrid electrodes for electrochemical supercapacitors" Nature Nanotechnology , 6 (4), pp. 232-236. (2011).

Lee et al.; "A simple and effective fabrication method for various 3D microstructures: backside 3D diffuser lithography" Journal of Micromechanics and Microengineering 18, 125015. (2008).

Lee et al; "Self-assembly of amorphous calcium carbonate microlens arrays" natature communications, 3, 725.(2012).

Maier et al; "Local detection of electromagnetic energy transport below the diffraction limit in metal nanoparticle plasmon waveguides" Nat. Mater. 2, pp. 229-232. (2003).

Meldrum and Ludwigs; "Template-Directed Control of Crystal Morphologies Macromol". biosciBiosci. 7, pp. 152-162. (2007).

Mitsui et al; "Optical fiber affinity biosensor based on localized surface plasmon resonance" Applied Physics Letters 85, pp. 4231-4233. (2004).

Ofte; "The Viscosities of Liquid Uranium, Gold and Lead" Journal of nuclear materials 22(1), pp. 28-32. (1967).

Oh and Campbell; "Thermal Desorption of Ge Native Oxides and the Loss of Ge from the Surface" Journal of Electronic Materials, vol. 33, No. 4, pp. 364-367.(2004).

Park and Meldrum; Synthesis of single crystals of calcite with complex morphologies Adv. Mater., 14, pp. 1167-1169. (2002).

Sangiorgi et al; "Wettability and Work of Adhesion of Nonreactive Liquid Metals on Silica", J. Am. Ceram. Soc. 71, pp. 742-748. (1988).

Sayed and Buriak; "Epitaxial Growth of Nanostructured Gold Films on Germanium via Galvanic Displacement", ACS applied materials & interfaces 2(12), pp. 3515-3524. (2010).

Sommerdijk and Cölfen; "Lessons fromNature—Biomimetic Approaches to Minerals with Complex Structures" MRS Bulletin. 35, pp. 116-121. (2010).

Tao et al; "Self-Organized Silver Nanoparticles for Three-Dimensional Plasmonic Crystals" Nano Letters 8, pp. 4033-4038. (2008).

Trivedi et al; Theory of Eutectic Growth Under Rapid Solidification Conditions Acta Metallurgica , 35(4), pp. 971-980. (1987).

Turnbull; "Correlation of Liquid-Solid Interfacial Energies Calculated from Supercooling of Small DropletsThe Journal of Chemical Physics" 18(5), pp. 769-769. (1950).

Turnbull; "Theory of Cellular Precipitation" Acta Metallurgica 3(1), pp. 55-63.(1955).

Vlachos et al; "Kinetics of faceting of crystals in growth, etching, and equilibrium" Physical Review B. 47, 4896. (1993).

Wang et al; "Thermodynamic modeling of the Au—Ge—Sn ternary system" Journal of Alloys and Compounds, 481(1), pp. 830-836. (2009).

Wang et al; "Experimental study on the influences of grain boundary scattering on the charge and heat transport in gold and platinum nanofilms" Heat and Mass Transfer, 47(8), pp. 893-898. (2011).

Weiner et al; "Choosing the Crystallization Path Less Traveled" Science 309, pp. 1027-1028. (2005).

Weiner and Addadi; "Crystallization Pathways in Biomineralization" Annu. Rev. Mater. Res. 41, pp. 21-40. (2011).

(56) References Cited

OTHER PUBLICATIONS

Wucher et al; "Designer Crystals: Single Crystals with Complex Morphologies", Chem. Mater. 19 ,pp. 1111-1119. (2007).
Ruqing Xu; "X-Ray Thermal Diffuse Scattering and Its Studies of Lattice Dynamics" (2010).
Yue et al; "Growth of single crystals in structured templates" Journal of Materials Chemistry. 16, pp. 408-416. (2006).
Yun et al; "Fabrication and characterization of carbon nanotube array electrodes with gold nanoparticle tips" Sensors and Actuators B 133 pp. 208-212. (2008).
Zhang et al; "Influence of grain boundary scattering on the electrical and thermal conductivities of polycrystalline gold nanofilms" Physical Review B, , 74(13), 134109. (2006).
Zielasek et al; "Gold Catalysts: Nanoporous Gold Foams", Angewandte Chemie International Edition, 45(48), pp. 8241-8244. (2006).
Jian, Zengyun et al. "Solid-Liquid Interface Energy of Metals at Melting Point and Undercooled State", Materials Transactions, vol. 43, No. 4 (2002) pp. 721-726.
Hieda, Mitsunori et al. "Ultrasensitive Quartz Crystal Microbalance With Porous Gold Electrodes", Applied Physics Letters, vol. 84, No. 4, Jan. 26, 2004; pp. 628-630.

\* cited by examiner

Fig. 12A
Fig. 12B
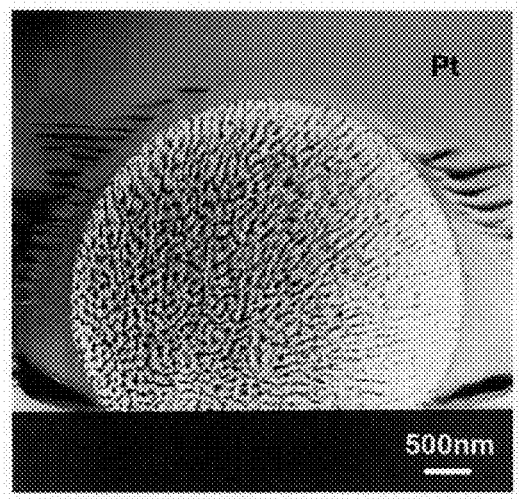
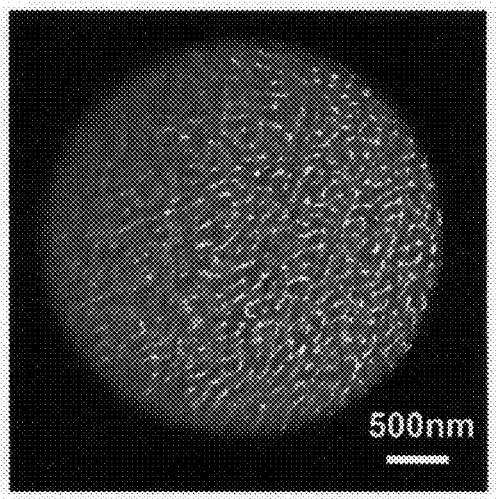
Fig. 12C
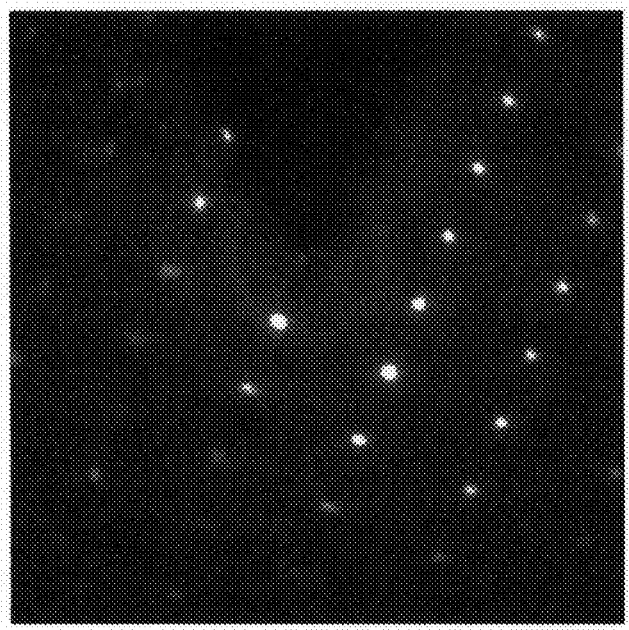

$\ln \tilde{A} = \ln(a/V_\infty J_0 B')$

PROCESS FOR PREPARATION OF MICRON-SIZED SINGLE CURVED CRYSTALS OF METALS

CROSS-REFERENCE TO RELATED APPLICATIONS

The present application claims the benefit of U.S. Provisional Application No. 61/974,005, filed Apr. 2, 2014, the entire content of which being herewith incorporated by reference as if fully disclosed herein.

TECHNICAL FIELD

The present invention relates to micron-sized single curved crystals of a metal, and to a process for the preparation thereof.

Abbreviations: CNT, classical nucleation theory; DIT, diffuse interface theory; EBSD, electron backscatter diffraction; EBSP, electron backscatter diffraction patterns; EDS, energy-dispersive X-ray spectroscopy; ESRF, European Synchrotron Research Facility; FCC, face-centered cubic; FIB, focused ion beam; HRSEM, high resolution scanning electron microscopy; HRTEM, high resolution transmission electron microscopy; SEM, scanning electron microscopy; STEM, scanning transmission electron microscopy; TEM, transmission electron microscopy.

BACKGROUND ART

In nature, biogenic crystals are often formed via amorphous precursors rather than classical nucleation and growth. Crystals grown in the laboratory by classical methods of nucleation and growth have facets dictated by the atomic structure and minimization of the surface free energy of the different orientation, wherein the facets are the low energy crystallographic planes (Vlachos et al., 1993). On the other hand, a remarkable outcome of crystal growth via an amorphous precursor is the ability of the organism to obtain unfaceted sculptured single crystals with rounded shapes including such crystals that are highly porous. Another outstanding advantage of growing crystals via this non-classical route is the fact that those crystals can be molded into any desired shape (Weiner et al., 2005, Weiner and Addadi, 2011, Fratzl et al., 2010, Sommerdijk and Cölfen, 2010).

Attempts have been made to mimic the growth of biogenic crystals with intricate shapes and morphologies (Cölfen, 2008). Thus, e g., single crystals of calcite were grown through the amorphous calcium carbonate precursor phase on micropatterned templates induced by a self-assembled monolayer on the template surface (Aizenberg et al., 2003), and single crystals of, e.g., calcium carbonate, lead(II)sulfate, and strontium sulfate were grown, using a sponge-like polymer membrane as a template, while being constrained into intricate shapes using that template (Wucher et al., 2007; Yue et al., 2006; Meldrum et al., 2007, Park and Meldrum, 2002). These processes were carried out using ceramic materials found in biogenic material such as $CaCO_3$, but no such attempts were made with widely used functional technological materials such as metals. Fashioning single crystals having curved intricate shapes from functional materials such as noble metals would have high research and technological potential, e.g., in photonics (micro-lenses and micro-mirrors) (Audran et al., 2010, Lee et al., 2012). Such crystals having highly porous morphology may be used in drug delivery or high adsorption sensors.

With such functional materials as the starting point, however, obtaining the curved morphologies achieved in biogenic crystals requires additional fabrication steps such as sculpturing, drilling, and polishing the single crystals, or using standard nano- and micro-fabrication techniques (Audran et al., 2010; Corso et al., 2009; Lee et al., 2008). Polishing and microfabrication have been carried out on curved crystals obtained with gold, but the curvature was on a scale of millimeters and not microns (Corso et al., 2009). On the other hand, to the best of our knowledge, these procedures nave not been applied on micron-sized single crystals.

SUMMARY OF INVENTION

In one aspect, the present invention relates to a process for the preparation of micron-sized single curved crystals of a metal spread over a supporting substrate, said process comprising:
(i) providing said substrate,
(ii) depositing vapors of a first metal and of a second metal on a surface of said substrate, thus forming a substrate deposited with either a thin film comprising said first and second metals, or two thin films each comprising a different metal of said first and second metals;
(iii) annealing said substrate deposited with said film(s) for a sufficient time period to form a eutectic melt that spontaneously dewets into micron-sized droplets spread over said substrate, said eutectic melt comprising two eutectic components at a selected composition ratio and characterized by a phase diagram, said eutectic components being said first and second metals; and
(iv) cooling said eutectic melt to room temperature, or removing one of said eutectic components from said eutectic melt, to consequently grow a single curved crystal of one of said metals, according to said phase diagram, in each one of said droplets, said crystal being growing in the confined space of said droplet replicating the shape of said droplet,
wherein said substrate being inert relative to said thin film(s) formed in step (ii); and the eutectic melt in step (iii) dewets within a temperature range allowing dewetting to occur prior to diffusion intermixing with said substrate and/or oxidizing. In a particular embodiment, the process of the invention further comprises the step of segregating the single curved crystals from said supporting substrate.

In another aspect, the present invention provides a supporting substrate having micron-sized single curved crystals of a metal spread thereover, obtained by the process defined above.

In a further aspect, the present invention provides a micron-sized single curved crystal of a metal. Particular such micron-sized single curved crystals are those obtained by the process defined above, wherein said process comprises the step of segregating the single curved crystals from the supporting substrate, i.e., micron-sized single curved crystals wherein the curvature of the crystal results from growth of said crystal in a confined space of a micron-sized droplet.

In still other aspects, the present invention provides a micro-lense, micro-mirror, micro-reflector, micro-antenna, electrode, or battery comprising a micron-sized single curved crystal of a metal as defined above, e.g., a micron-sized single curved crystal of a metal obtained by the process of the invention.

BRIEF DESCRIPTION OF DRAWINGS

FIGS. 12A-12C show (12A) STEM micrograph of the droplet cross section, microstructure of the gold after Ge etching; (12B) area of diffraction with aperture from the droplet in 12A, and (12C) single crystal diffraction taken from the area at 12B, fully indexed within the gold structure (zone axis, Z.A., [121]).

Figure 1A:
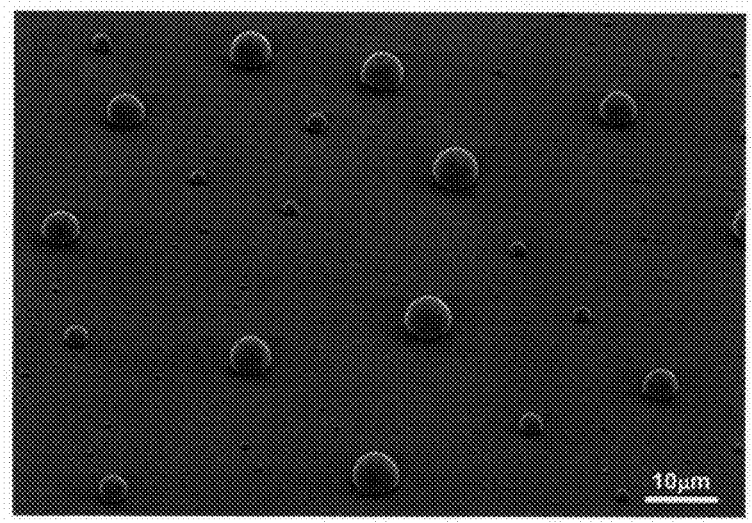
FIGS. 1A-1C show HRSEM micrographs of Au—Ge droplets after dewetting: (1A) a large area view of the dewetted surface revealing several droplets (52° tilt); (1B) a side view (60° tilt) of a curved gold single crystal within a micro droplet; and (1C) a top view of the droplet in 1B.

$$\Psi(y) = \frac{\exp(-y^2)}{y} - \sqrt{\pi}\,\mathrm{erfc}(y) = A; \qquad (17A)$$

and a graphic illustration of the solution for $A_1=2\cdot10^{21}$ and $A_2=2\cdot10^{19}$; the solutions are y=6.535 and y=6.185, respectively (17B).

DETAILED DESCRIPTION OF THE INVENTION

Inspired by biogenic curved single crystals, as found herein in accordance with the present invention, micron-sized single crystals of a metal such as gold or germanium, exhibiting curved surfaces, can be grown from the confined volume of a droplet of a eutectic composition melt which forms via the dewetting of nanometric thin films, replicating the shape of the droplet, with no need of any fabrication steps.

As particularly shown in Study 1 hereinafter, thin films of two materials which create eutectic microstructure one with each other (as exemplified herein, gold and germanium, or silver and germanium) are evaporated on a non-reactive surface. Heating the sample to the eutectic temperature leads to melting of the films and reveals a eutectic melt on the surface. By choosing an appropriate substrate with low surface energy, dewetting occurs and droplets of the melt are created. Then, fast cooling preserves the shape of the droplets and the eutectic microstructure. To achieve this phenomenon a number of factors must coexist. The substrate must be inert relative to the thin films, dewetting of the thin film melt must be achieved so as to create droplets on the surface, crystallization from a melt must be possible in the relevant environment, and the materials must not react (e.g., via oxidation) with the environment. As further found, the curvature of the micron-sized curved single crystals obtained can be controlled by controlling the environment in which the process is carried out, including parameters such as the contact angle and the curvature of the drops by changing the surface tension of the liquid drop during crystal growth.

Study 1 further presents an energetic model that explains this phenomenon and predicts why and under which conditions crystals will be forced to grow with the curvature of the micro-droplet even though the energetic state of a curved single crystal is very high. Study 2 shows the preparation of nanoporous single crystals having micron size and intricate morphologies, based on the process shown in Study 1, wherein said process further comprises etching one of the components, following the cooling step, leading to a porous single crystal structure of the second component.

In one aspect, the present invention thus relates to a process for the preparation of micron-sized single curved crystals of a metal spread over a supporting substrate, said process comprising:
(i) providing said substrate;
(ii) depositing vapors of a first metal and of a second metal on a surface of said substrate, thus forming a substrate deposited with either a thin film comprising said first and second metals, or two thin films each comprising a different metal of said first and second metals,
(iii) annealing said substrate deposited with said film(s) for a sufficient time period to form a eutectic melt that spontaneously dewets into micron-sized droplets spread over said substrate, said eutectic melt comprising two eutectic components at a selected composition ratio and characterized by a phase diagram, said eutectic components being said first and second metals; and
(iv) cooling said eutectic melt to room temperature, or removing one of said eutectic components from said eutectic melt, to consequently grow a single carved crystal of one of said metals, according to said phase diagram, in each one of said droplets, said crystal being growing in the confined space of said droplet replicating the shape of said droplet,
wherein said substrate being inert relative to said thin film(s) formed in step (ii), and the eutectic melt in step (iii) dewets within a temperature range allowing dewetting to occur prior to diffusion intermixing with said substrate and/or oxidizing.

The term "single crystal" as used herein, also known as "monocrystalline solid", refers to a material in which the crystal lattice of the entire sample is continuous and unbroken to the edges of the sample, with no grain boundaries. Such a monocrystal, having no defects associated with grain boundaries, has unique properties, particularly mechanical, optical and electrical, may also be anisotropic, depending on the type of crystallographic structure; and thus are industrially used in various applications, e.g., in optics and electronics. The single crystals prepared by the process of the present invention grow from the confined volume of a droplet of a eutectic composition melt which is formed via the dewetting of nanometric thin films. As shown herein, the curvature of these crystals can be controlled by controlling the environment in which the process is carried out, e.g., the contact angle and the curvature of the drops by changing the surface tension of the liquid drop during crystal growth. The term "single curved crystals" as used herein thus refers to a single crystal as defined above having the curvature resulting from the growth of said crystal in a confined space of a droplet.

A phase diagram is a type of chart used to show conditions at which thermodynamically distinct phases can occur at equilibrium. The term "eutectic system" as used herein refers to a homogeneous solid mix of atomic species (e.g., Au—Ge or Ag—Ge as exemplified herein), to form a joint super-lattice, by striking a unique atomic percentage ratio between the components—as each pure component has its own distinct bulk lattice arrangement. It is only in this atomic/molecular ratio that the eutectic system melts as a whole, at a specific temperature (referred to as the eutectic temperature) the super-lattice releasing at once all its components into a liquid mixture. The term "eutectic melt" refers to a liquid that contains both elements, i.e., both eutectic components, from the described eutectic system. Further details about eutectic systems can be found in Callister, W. D.; and Rethwisch, D. G., *Materials science and engineering: an introduction,* 2007, 7, Wiley New York, the entire content of which being herewith incorporated by reference as if fully disclosed herein.

According to the present invention, and as shown in the experimental section hereinafter, depending on certain parameters such as the ratio between the first and second metals, i.e., eutectic components, in the eutectic melt formed in step (iii) of said process, the single curved crystals obtained in step (v) may each be fully or partially wrapped with a solid phase having a eutectic microstructure. In such cases, the process of the present invention may further comprise removal of the other one of said metals from the solid phase to thereby obtain single curved crystals of said one of said metals having a center and a nanoporous structure wrapping said center. In particular such cases, the process of the invention practically comprises wet etching of the other one of said metals. Micron-sized single curved crystals obtained in such cases are, in fact, partially nanoporous.

In other cases shown herein, the eutectic melt formed in step (iii) of said process comprises the eutectic concentration of the eutectic components, i.e., first and second metals, and step (iv) comprises cooling of said eutectic melt to room temperature to consequently form a eutectic phase microstructure comprising said single curved crystal. In such cases, the process of the present invention may further comprise removal of the other one of said metals from said solid phase having a eutectic microstructure. In particular such cases, the process of the invention practically comprises wet etching of the other one of said metals. Micron-sized single curved crystals obtained in such cases are thus fully nanoporous, i.e., have a center and a nanoporous structure wrapping said center.

The single crystals exemplified herein, e.g., the Au or Ge single crystals, were grown within micro droplets of a eutectic melt of said two metals prepared by, first, depositing vapors of Au and Ge on the surface of the supporting substrate, forming two adjacent thin films each comprising a different one of these metals. Nevertheless, it should be understood that according to the present invention, vapors of the metals required so as to form, upon annealing, the eutectic melt may be deposited on the surface of the substrate at any sequential order as well as concurrently (forming a single thin film comprising the two metals), depending, inter alia, on the deposition technique or equipment utilized.

Step (ii) of the process of the present invention comprises annealing of the substrate with the thin film(s) deposited thereon, for a sufficient period of time, to form—upon reaching the eutectic temperature—a eutectic melt comprising said first and second metals as the two eutectic components, at a predetermined composition ratio. The eutectic melt formed spontaneously dewets into micro droplets spread over said substrate, in which the single crystals are then grown. The annealing may be carried out under any atmospheric conditions, providing that the thin film(s) material is not strongly oxidized before the film(s) dewets. In particular cases, the annealing is conducted under nitrogen, forming gas (i.e., a mixture of hydrogen and nitrogen, usually generated upon dissociation of ammonia), or argon atmosphere, or under vacuum.

The supporting substrate used in the process of the present invention may be made of any suitable material, provided that said substrate is inert relative to the thin film(s) formed on its surface, i.e., has no chemical interaction with said film(s); and that the eutectic melt formed in step (iii) dewets within a temperature range allowing dewetting to occur prior to diffusion intermixing with said substrate.

In certain embodiments, the supporting substrate used according to the process of the present invention is either made of or coated with silicon dioxide (silica), titanium dioxide (titania), magnesium oxide (magnesia), or aluminum oxide (alumina). In other embodiments, the supporting substrate used is a spinel, i.e., a mineral of the general formula $A^{2+}B^{3+}_2O^{2-}_4$, which crystallizes in the cubic (isometric) crystal system, wherein the oxide anions arranged in a cubic close-packed lattice, and the cations A and B occupying some or all of the octahedral and tetrahedral sites in the lattice, and are being selected from divalent, trivalent or quadrivalent cations of magnesium, zinc, iron, manganese, aluminum, chromium, titanium or silicon (A and B may also be the same metal with different oxidation states, i.e., under different charges, e.g., $Fe^{2+}Fe^{3+}_2O^{2-}_4$ (magnetic; $Fe_3O_4$). Examples of spinels include, without being limited to, aluminum spinels such as $MgAl_2O_4$, $BeAl_2O_4$, $ZnAl_2O_4$, $FeAl_2O_4$ and $MnAl_2O_4$, iron spinels such as $CuFe_2O_4$, $MnFe_2O_4$, $MgFe_2O_4$, $Fe_3O_4$, $NiFe_2O_4$ and $TiFe_2O_4$, and chromium spinels such as $FeCr_2O_4$, $MgCr_2O_4$, $ZnCr_2O_4$.

In certain embodiments, the first and second metals used in the process of the present invention are selected from Au, Ag, Ge, Cu, or Pt, i.e., the eutectic melt from which the single crystals are grown comprises a composition of any two of said metals, i.e., Au—Ag, Au—Ge, Au—Cu, Au—Pt, Ag—Ge, Ag—Cu, Ag—Pt, Ge—Cu, Ge—Pt, or Cu—Pt, and the single curved crystals obtained in step (iv) are substantially made of one of the metals of the combination used, according to the phase diagram of the eutectic melt and the condition of the process as described in the experimental section. In particular embodiments exemplified herein, the eutectic components utilized are Au and Ge, or Ag and Ge, and the single curved crystals obtained are substantially made of one of the metals of the combination used, according to the phase diagram of the eutectic melt and the condition of the process.

As shown herein, the shape of the single curved crystals obtained by the process of the present invention is determined by the shape of the confining micron-sized droplet formed during the annealing step; and moreover, the shape of those micron-sized droplets can be controlled, practically controlling the shape of the single curved crystals obtained by the process, by changing the contact angle and the droplet curvature, which is affected by the surface tension. The parameter with the greatest influence on the shape of the droplets was found to be the oxygen partial pressure in the annealing environment, wherein alteration in oxygen partial pressure changed the contact angle and the surface tension of the droplet. In certain embodiments, the shape of the micron-sized droplets formed in step (iii) of said process is controlled, e.g., by changing the contact angle and the droplet curvature, more particularly by altering the oxygen partial pressure in the annealing environment.

The product obtained by the process of the invention as defined above is a supporting substrate on which the single curved crystals grown are spread. Such products may be used for various applications, e.g., in micro-lenses, micro-mirrors, micro-reflectors, micro-antennas, electrodes, and batteries, and may be predesigned so as to get a particular required pattern of the single crystals over the substrate. Yet, in certain embodiments, the process as defined above, is any one of its embodiments, further comprises the step of segregating, i.e., harvesting, the single curved crystals obtained from said supporting substrate. This step may be carried out utilizing any available technology suitable for this purpose.

In another aspect, the present invention provides a supporting substrate having micron-sized single curved crystals of a metal spread thereover, obtained by the process of the invention In a further aspect, the present invention provides a micron-sized single curved crystal of a metal. In certain embodiments, the micron-sized single curved crystals of the present invention are obtained by the process defined above, provided that said process comprises the step of segregating, i.e., harvesting, the single curved crystals from the supporting substrate. Particular such micron-sized single curved crystals are those wherein the curvature of the crystal results from growth of said crystal in a confined space of a micron-sized droplet. As shown herein, specific such single curved crystals may be fully or partially nanoporous. The micron-sized single curved crystals of the invention may be used in various technological applications, e.g., optics and electronics, as well as drug delivery.

In still other aspects, the present invention provides a micro-lense, micro-mirror, micro-reflector, micro-antenna, electrode, or battery comprising micron-sized single curved crystals of a metal as defined above, e.g., micron-sized single curved crystals of a metal obtained by the process of the invention, including such crystals that are either partially or fully nanoporous.

The invention will now be illustrated by the following non-limiting Examples.

Examples

Study 1. Preparation of Micron-Sized Single Curved Crystals of Metals
Materials and Methods
Sample Preparation. $SiO_2$ (100 nm) was grown on (001) Si wafers by thermal oxidation at 1100° C. Gold and germanium (99.999% pure, Sigma-Aldrich) were evaporated onto the $SiO_2$ substrate in an e-beam-equipped AircoTemescal FC-1800 evaporating system under a high vacuum of $10^{-7}$ Torr, at room temperature, yielding a normal deposition rate of 8 Ås$^{-1}$. Thermal annealing of Au—Ge samples was performed at 550° C. in a nitrogen environment (99.999%) for 10 min to 3 h in a laboratory tube oven with gas flow, and in an Anton Paar DHS 1100 Domed Hot Stage connected to a rotation pump.

Sample Characterization.

For surface imaging by SEM, an FEI ESEM Quanta 200 (combining EDS and EBSD) and a Zeiss Ultra plus HRSEM, were used. Cross-section micrographs were obtained using a Strata 400 STEM dual-beam FIB field emission scanning electron microscope. TEM diffraction was obtained utilizing a Titan 80-300 KeV FEG-S/TEM. The single crystal was characterized with the micro-diffraction technique at the ID13 Microfocus Beamline of the ESRF, Grenoble, France. One branch of this beamline is specialized on scanning nano-beam diffraction experiments. Synchrotron light focused by means of Si-based compound refractive lenses in crossed geometry, so-called nano-focusing lenses, at a wavelength of 0.832 Å was utilized for the experiment. The beam size was 170×150 nm$^2$ (full width of half maximum of the beam intensity) delivering a flux of $10^{10}$ photons/sec in the focal spot. The sample position was controlled via piezo stages with 20 nm resolution. Two-dimensional maps of diffraction patterns have been recorded using a FRELON CCD detector with 2048×2048 pixels of 50 μm in size In the present study we were able to produce curved micron-sized gold single crystals by utilizing confined droplets within which a single growing crystal could be confined. The idea was that if we could control the size and shape of the droplet, we would be able to control the size and shape of the single crystal growing inside it. The mechanism we employed for the formation of such droplets was the dewetting phenomenon of nanometric thin films. To introduce dewetting into liquid droplets, a thin film needs to be brought to its melting point. A eutectic system such as Au—Ge seemed an ideal choice for this purpose owing to relatively low temperature at which the liquid state can be achieved ($T_E$=361° C.) (Okamoto and Massalski, 1984). If a eutectic film of Au—Ge is deposited on a non-wetting surface such as SiO$_2$, on reaching the eutectic temperature it dewets and produces liquid droplets.

Metal nano- and micro-nanoparticles are widely used in a variety of applications, such as magnetic memory arrays (Cheng et al., 2001, Klemmer et al., 2003), plasmonic waveguides (Maier et al., 2003), plasmonic sensors (Mitsui et al., 2004), biological sensors (Fritzsche and Taton, 2003) and catalysis of other structures such as nanowires and nanofiber growth (Guan et al., 2008, Kodambaka et al., 2007). One of the applications for Au nanoparticles is catalytic growth of nanostructures such as carbon nanotubes (Yun et al., 2008) and germanium nanowires (Adhikari et al., 2006) Growing of metal nano- and micro-particles can be achieved by different methods, e.g., by self-assembly chemical processes (Tao et al., 2008), lithography (Lee et al., 2008), or dewetting of thin films through solid (Kwon et al., 2013) or liquid state dewetting (Kojima and Kato, 2008). The dewetting process can be reached by different techniques, such as thermal annealing (Carey et al., 2003), electron beam (Kojima and Kato, 2008) or lasers (Corso et al., 2009).

In the present study we produced Au—Ge thin films by evaporating thin layers of Au and Ge on oxidized Si wafers. The thicknesses of the films were altered (Au 100-200 nm, Ge 50-100 nm) according to the composition ratio needed. For example, to achieve a eutectic melt composition (28 at % Ge), the Au and Ge thin films were 150 nm and 78 nm thick, respectively. Samples were annealed at 550° C. for durations varying from 10 min to 3 h, and were then cooled to a room temperature at the rate of 200° C. min$^{-1}$ The annealing environment was N$_2$ (99.999%), with or without pump purging prior to annealing (pump purging reached 10$^{-3}$ torr before annealing).

Figure 1B:
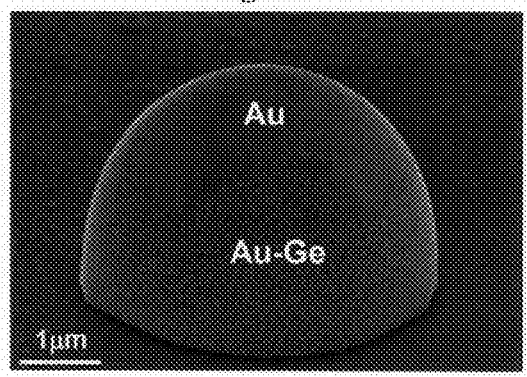
Figure 1C:
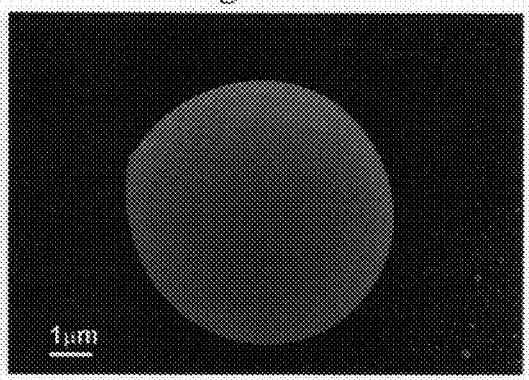
Figure 2:
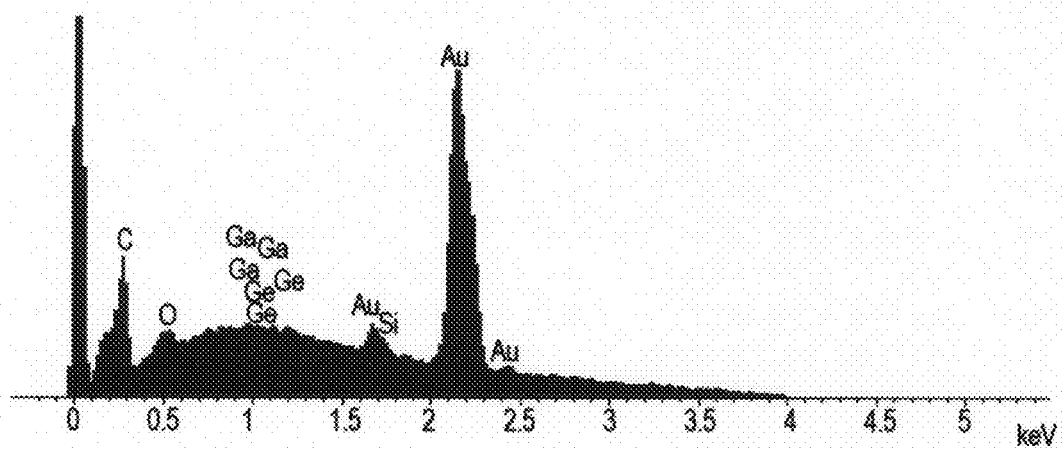
FIG. 2 shows EDS spectrum of the gold single crystal (68.81 at % Au; 0.44 at % Ge; 2.70 at % O; 27.39 at % C; 0.33 at % Si; 0.34 at % Ga). The Ga is due to FIB preparation.
Figure 3A:
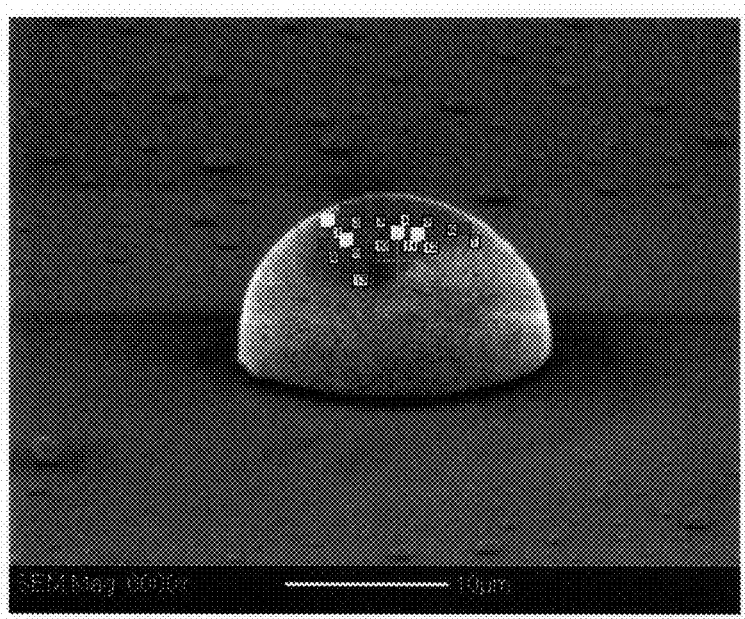
FIGS. 3A-3C show: (3A) A SEM micrograph of a eutectic droplet with a curved single crystal. The dots on the single crystal represent the positions from which the EBSPs were taken; (3B) The orientation of the single crystal that was obtained for all the positions marked in 3A; (3C) An example of EBSP which was obtained from one of the points marked in 3A (all the EBSPs from the marked positions in 3A were the same).
Figure 3B:
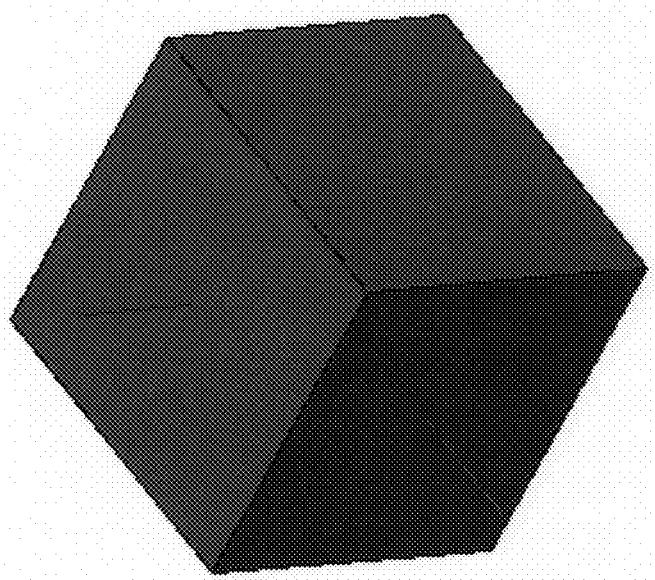
Figure 3C:
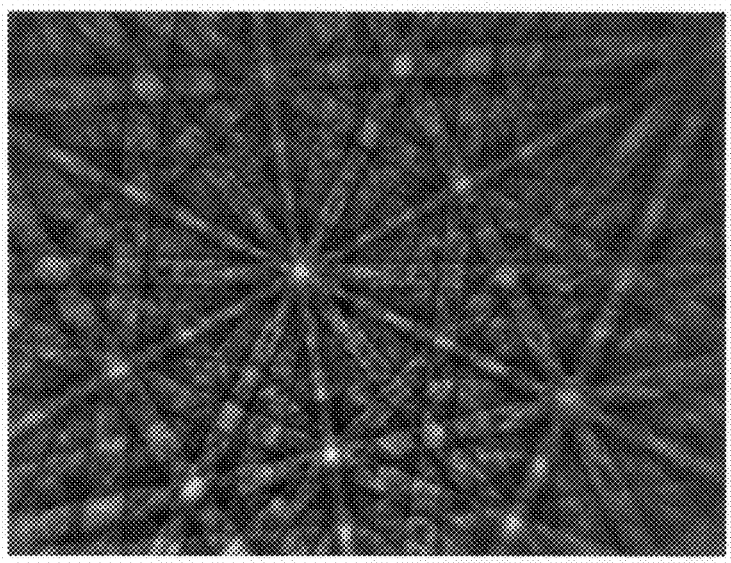
Figure 4A:
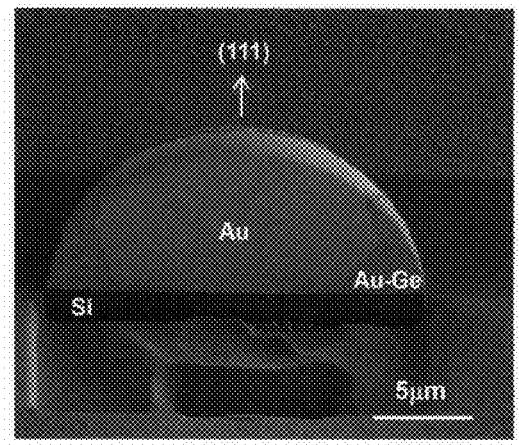
FIGS. 4A-4C show HRSEM micrograph of a droplet cross-section obtained by FIB, revealing facets inside the droplet but a curved shape on the surface (4A); TEM diffraction obtained from the single crystal area (Z.A.—zone axis) (4B); and truncated octahedron (4C).

During the annealing process, dewetting led to the formation of droplets of Au—Ge under which Au single crystals were formed (FIG. 1) EDS examination of the single crystals proved that they were gold and that the surrounding eutectic phase contained a combination of gold, germanium and oxygen (oxidized Ge) (FIG. 2). The single crystals inside the droplets were further examined by EBSD (FIG. 3). The EBSD mapping of these gold crystals over an area of 5×5 μm$^2$ revealed identical EBSP over the entire scanned area, affirming that these were indeed single crystals. As the EBSD signal comes from nearly 100 nm below the surface, we wanted to further confirm that these crystals are single throughout their entire volume. To this end we prepared cross-sections of these droplets utilizing a FIB. This enabled us to observe that each crystal was faceted inside the droplet but possessed a curved surface confined by the droplet's surface. Moreover, the three-dimensional curvature of these single crystals was identical to that of the droplets (FIG. 4A). Using FIB we sliced about a hundred droplets, all of which revealed similar internal crystal morphologies and curved surfaces.

In our opinion, the only way to create a curved surface from a single crystal of gold is by the formation of atomic steps on the surface, while a higher degree of curvature will lead to a higher density of atomic steps (Corso et al., 2009). The morphology of the faceted area of the gold single crystals inside a droplet is a truncated octahedron, which is the most preferable equilibrium shape of gold (FIG. 4C) (Barnard et al., 2005). The exposed facets within the droplet (not on the droplet's surface) reveal the {111} and {110} planes of the truncated octahedron. The facets that can be seen in the FIB cross sections depend on the relative orientation of the cutting during the FIB cross section preparation. In relation to the orientation of the single crystals of gold relatively to the substrate, we can conclude that in most cases the orientation is that of the {111} or close to it.

Figure 4B:
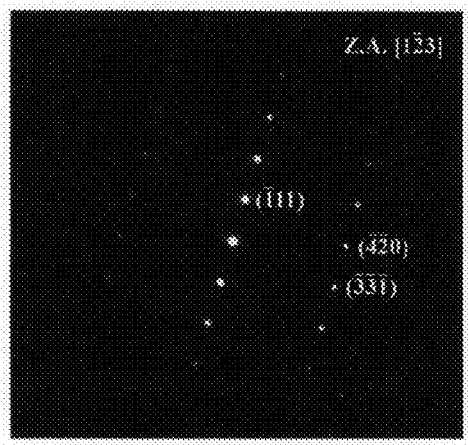
Figure 4C:
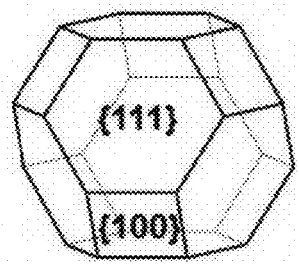

As part of our quest to confirm the single crystal nature of the curved gold crystals, we performed TEM on thin cross-sections of droplets prepared using the FIB (FIG. 4B). By performing selective area diffraction in the TEM from an area with a diameter of 500 nm, we were able to observe a single crystal diffraction pattern that could be fully indexed within the gold structure Identical electron diffraction patterns were obtained from all parts of the single crystal.

Figure 5A:
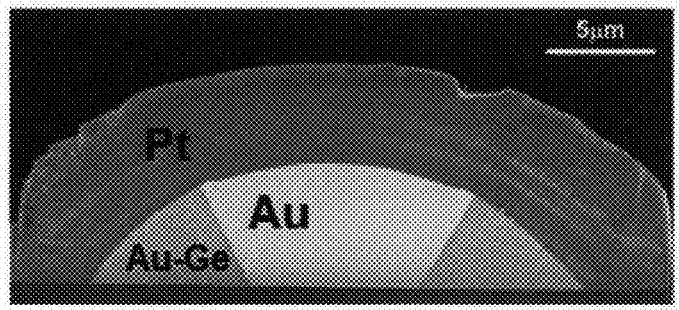
FIGS. 5A-5E show (5A) cross-section of a droplet prepared utilizing the FIB which was used for the high-resolution X-ray scan. The droplet was covered with Pt in order to protect it during the ion beam etching; (5B) A binary mask derived from mapping of average intensity by simple thresholding in each diffraction pattern, representing X-ray fluorescent background of the scanned gold crystal; (5C) Average diffraction pattern of all corrected images of the area in 5B (1793 diffractions). Nano-beam Kossel lines can be observed due to the Au-fluorescence; (5D) Corrected (spatial distortion and flat field) diffraction pattern of scan point which was taken from the center of the single crystal, marked with a circle on 5B, for reference; and (5E) High pass filtered version of the average image enhancing the Kossel-lines.
Figure 5B:
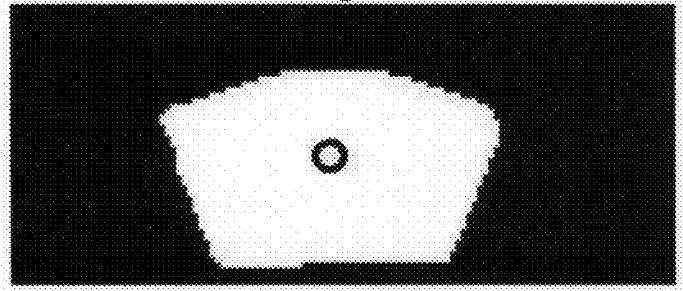
Figure 5C:
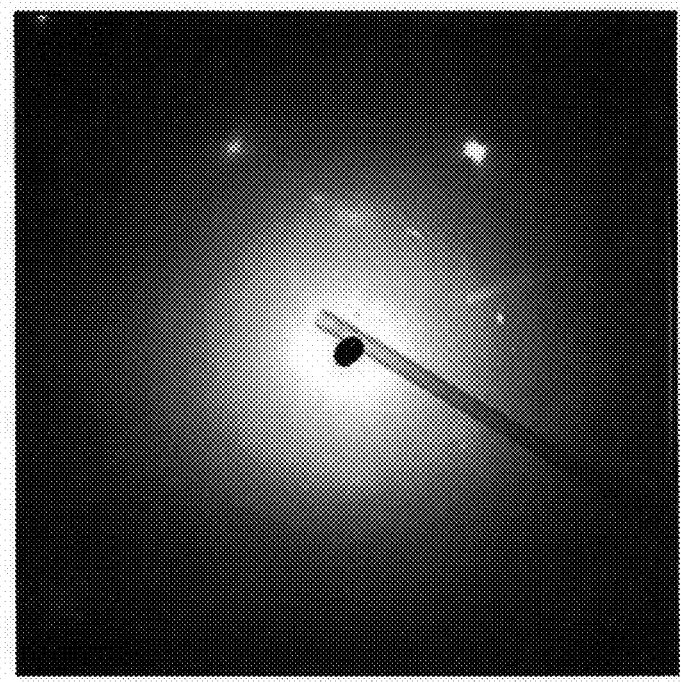
Figure 5D:
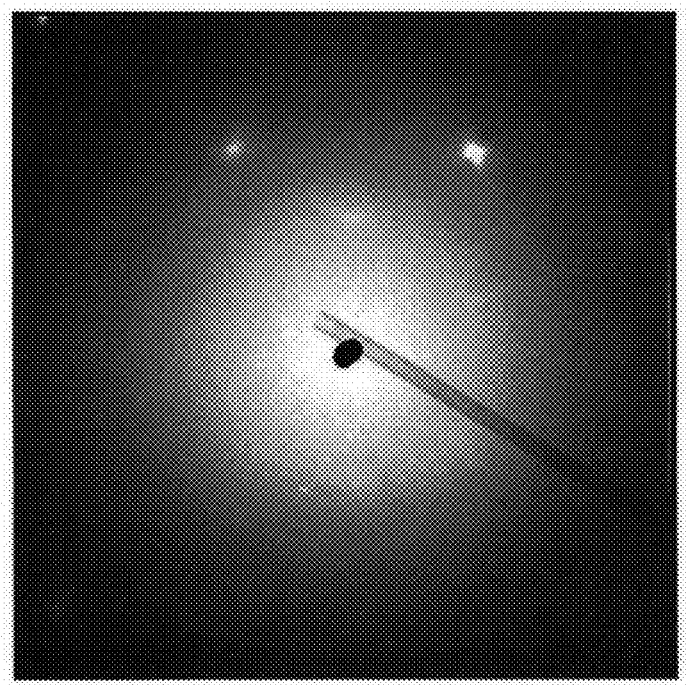
Figure 5E:
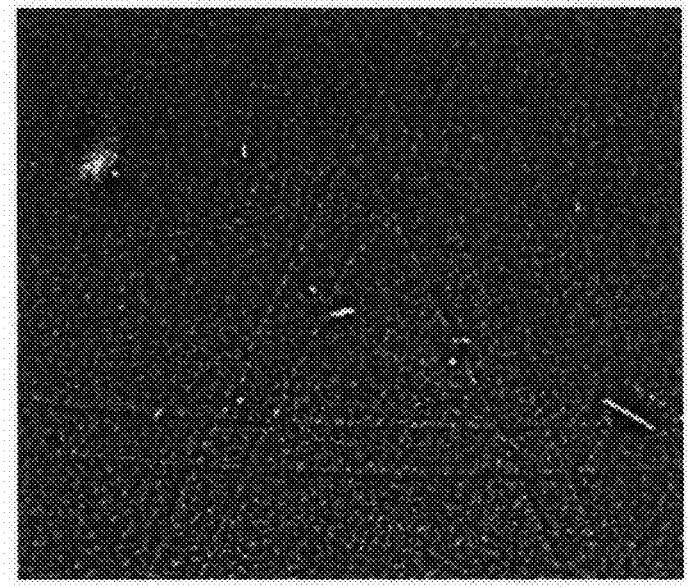
Figure 6:
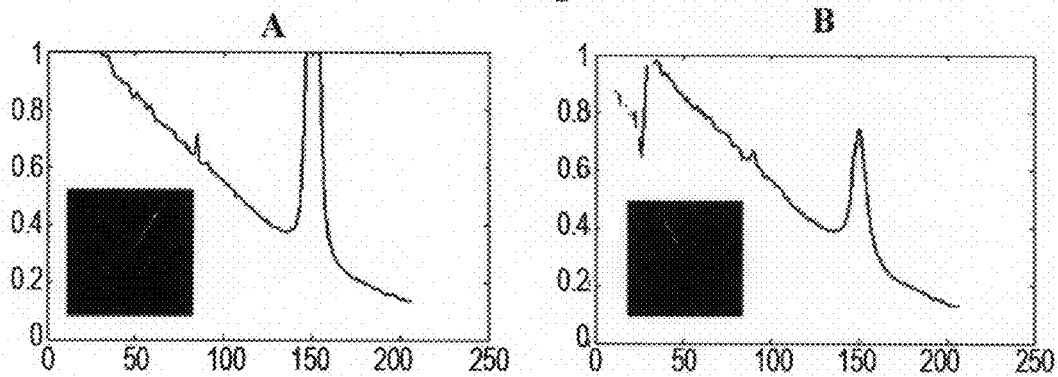
FIG. 6 shows: (panels A-B) the scattering intensity plotted for two different azimuthal angles as a function of radial distance for average diffraction pattern (the scan line is shown in the inset). The peak diffraction is positioned 150 px from the center. The radial angle between two scans is 61.52°. (panels C-D) The scattering intensity plotted for two different azimuthal angles as a function of radial distance for single diffraction pattern (the scan line is shown in the inset). The peak diffraction is positioned 150 px from the center. The radial angle between two scans is 61.34°; (panel E) Average diffraction pattern, scans (A) and (B) are marked, (panel F) Average diffraction pattern, scans (C) and (D) are marked.
Figure 6:
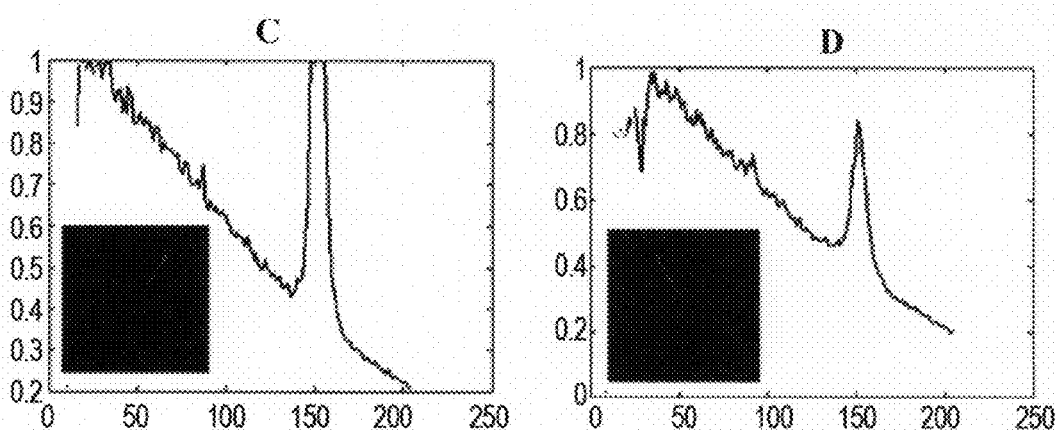
Figure 6:
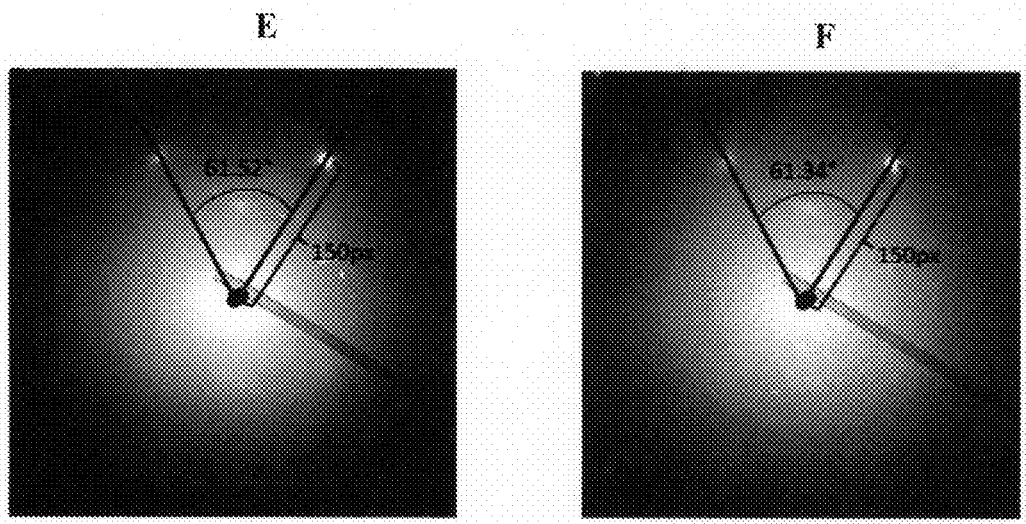

In order to obtain additional proof that these crystals were single, we also used sub-micron scanning synchrotron diffractometry (ID13, ESRF, Grenoble, France) on a FIB-sectioned crystal of gold (FIG. 5A). At each point of the scanned area (1793 scanning points) the same thermal diffuse scattering pattern of a bulk single crystal was observed (Xu, 2010). We also verified this by averaging all the 1793 diffraction images from the different locations of the crystal, and found that this integrated image remained identical to any one of the individual diffraction images (FIGS. 5C-5D). For quantitative comparison of both diffractions presented in FIGS. 5C-5D, the scattering intensity was plotted for two different azimuthal angles as a function or radial distance (FIG. 6). Therefore, it could be seen that the bright diffraction spots in both FIGS. 5C-5D generated peaks in the same azimuthal angle and same radial distance (d-spacing). Furthermore, a single crystal Kossel line pattern emerging from Bragg-type diffraction of gold X-ray fluorescence radiation generated by the primary beam was clearly visible in the averaged pattern (Kossel et al., 1935). An indication of this Kossel pattern, however noisy, can even be seen on the individual patterns (on high quality displays). The lines appear very pronounced when zooming in to a high pass filtered version of the averaged image (FIG. 5E). These two latter experiments provided conclusive proof that the curved gold crystals were indeed perfect single crystals.

Figure 7A:
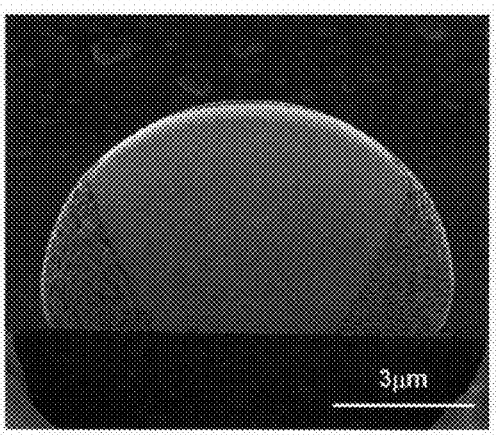
FIGS. 7A-7B show the effect of annealing conditions on the droplet contact angle Eutectic sample annealed with (7A) or without (7B) pump-purging prior to annealing.
Figure 7B:
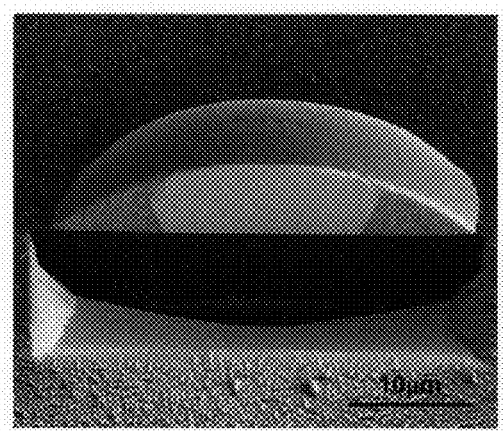

In addition to the demonstration that curved single gold crystals can be grown, we wanted to show that the shape of the single crystals can be controlled. This is an extremely important feature for any potential application of such curved crystals. Having shown that the shape of the single crystals is determined by the shape of the confining droplet, we now aimed to control the droplet shape. This can be done by changing the contact angle and the droplet curvature, which is affected by the surface tension. The parameter with the greatest influence on the shape of the droplets was found to be the oxygen partial pressure in the annealing environment. The size of the drop did not influence the droplet shape, as the droplet was much smaller than capillary size (2.6 mm for liquid gold). In samples that were vacuum-pumped ($10^{-3}$ torr) prior to the flow of inert $N_2$ (99.999%) the contact angle was in the range of 90°-110°, whereas in samples prepared under an ambient flow of $N_2$ with no pre-pumping, the contact angle was in the range of 20°-45° (FIG. 7). According to the Young-Laplace equation, the change in the contact angle is affected by the surface tension of the droplet, the surface energy of the substrate, and the interfacial energy between them. Our results showed that the alteration in oxygen partial pressure changed the contact angle and the surface tension of the droplet.

In producing such crystals of various materials, however, several guidance rules or conditions need to be met. These are discussed below.

The concept of growing curved single crystals by crystallization from a melt within a micro-droplet, as described above, is a simple one; however, in translating this concept technically into a generalized phenomenon, a number of guiding principles must apply. First, there must be no interaction (such as diffusion) between the thin film and the supporting substrate, as this would not only lead to a change in the composition of the film but would also enhance wetting (thus obviously preventing dewetting). In the specific system presented here (Au—Ge on Si), a eutectic reaction occurs at the relatively low temperature of 363° C. (Okamoto and Massalski, 1984) and would instantly lead to rapid diffusion of gold into silicon, thereby instantly shifting the eutectic Au—Ge composition from its original one. Because we have previously found the native Si oxide to be insufficient as a barrier to diffusion, a thick (~100 nm) oxide layer was thermally grown and served as an effective diffusion barrier (Borukhin and Pokroy, 2011). Evaporation of gold on the $SiO_2$ was followed by a germanium evaporation. This sequence prevented direct contact between Ge and $SiO_2$, which would have led to wetting rather than dewetting (Sangiorgi et al., 1988; Eustathopoules and Drevet, 1998).

The second rule is that the composition of the thin films should be chosen such that the ensuing liquid phase causes the crystallization process to be rapid and large single crystals to be formed from the melt (fast diffusion). In our system we utilize the eutectic phase diagram, which shows that in this way the crystallization can be achieved by crossing the solidus line either vertically, by slow cooling, or horizontally, by slow removal of one of the eutectic components. In the Au—Ge system we can start either from a hypoeutectic composition crossing the solidus line vertically, or from a eutectic composition crossing the solidus line horizontally by annealing in an environment that contains oxygen. It turns out that by this latter route germanium oxidizes finally to GeO, which easily sublimes and leads to GeO evaporation (Oh and Campbell, 2004). The result of this process is the precipitation of gold.

The third governing rule is that the material of the thin films should not strongly oxidize before the film dewets, and should melt within a temperature range that will allow dewetting to occur prior to diffusion intermixing with the substrate. In the system used herein, the eutectic temperature of the Au—Ge is relatively low. Because the Ge thin film is the upper one, its surface harbors a native Ge oxide, however, this oxide desorbs from the surface during the annealing, leaving only Ge on the surface (Oh and Campbell, 2004), and therefore does not interfere with the dewetting process.

Figure 8A:
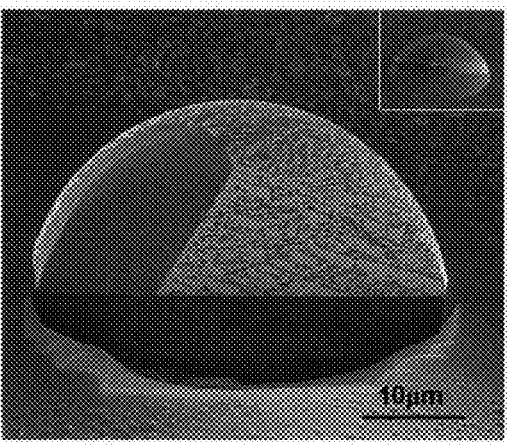
FIGS. 8A-8B show HRSEM micrographs of cross-sections of droplets with Ge single crystal grown inside (8A) The Ge single crystal was grown from a hypereutectic liquid phase in the Au—Ge system, and the inset shows the same droplet before FIB milling. (8B) The GE single crystal was grown from hypereutectic liquid phase in the Ag—Ge system, and the inset shows the same droplet before FIB milling.

The method described herein for growing curved crystals will work only when all three of the above guidelines are followed. Having shown not only that curved single crystals can be obtained but also that their curvature can be controlled, we wanted to further show that this is not indeed an isolated phenomenon but a general one. We successfully demonstrated this by growing Ge single crystals in the Au—Ge system using a hypereutectic concentration (obtained by changing the initial thickness of the evaporated thin films (120 nm Au, 107 nm Ge) to obtain a hypereutectic concentration of the melt (40 at % Ge, FIG. 8A).

Figure 8B:
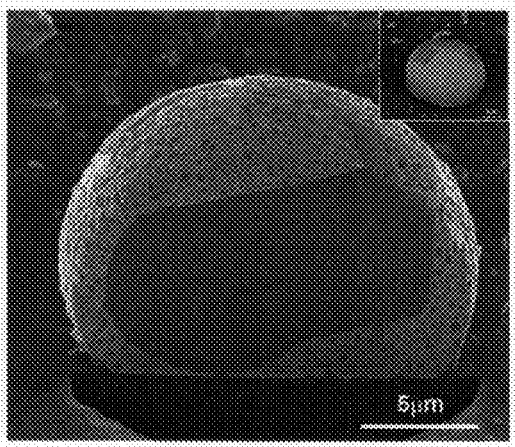
Figure 9:
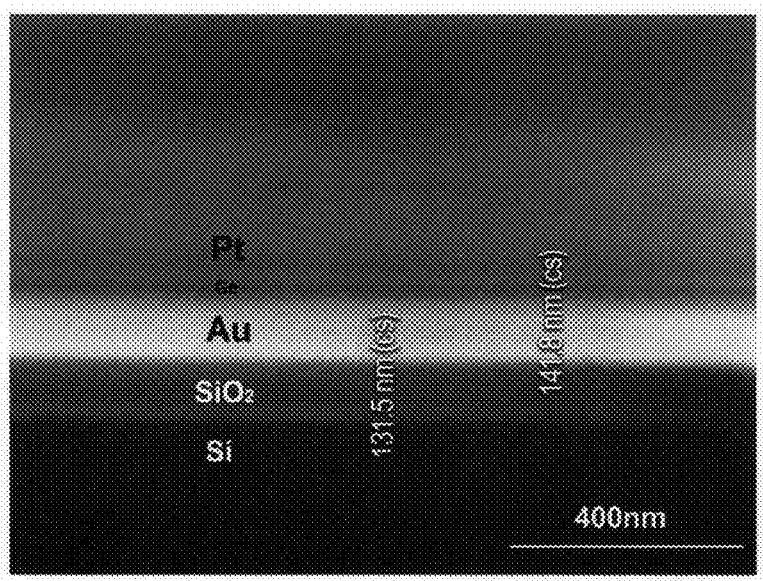
FIG. 9 shows cross section of the thin film before annealing, prepared utilizing the FIB. A thick layer of Pt was deposited on the surface to protect it during the milling.

Yet another system we tested was the Ag—Ge thin films, evaporated on the oxidized Si substrates (Ag 40 nm, Ge 212 nm, 20 at % Ag), followed by annealing at 850° C. for 10 min and then cooling to room temperature at the rate of 200° C. $min^{-1}$ in a forming gas environment (7.5% $H_2+N_2$, 99.99%) Ge single crystals were observed inside the droplets, confined by the shape of the droplets (FIG. 8B).

To understand the energetic considerations that allow for growth of the curved single crystals, we have developed an energetic model. Surface energy can be estimated by a number of broken or altered interatomic bonds. The energy required to generate two surfaces of area 2A is the following:

$$E = An_s(z_b - z_s)E^{ss} \tag{1}$$

where $E^{ss}$ is the bond energy between the pair of nearest atoms, $z_b$ and $z_s$ are the numbers of nearest neighbors for bulk and surface atoms, and $n_s$ is the surface density of atoms. The number $(z_b - z_s)$ is the number of broken bonds. The surface tension $(\gamma_{sv})$ of the solid/vacuum surface is given by:

$$\gamma_{sv} = \frac{E}{2A} = \frac{1}{2}n_s(z_b - z_s)E^{ss} \tag{2}$$

The surface tension of the solid/liquid surface can be evaluated in a similar way as $$\gamma_{sl} = \frac{E}{2A} = \frac{1}{2}n_s(z_b - z_s)(E^{ss} - E^{sl}), \tag{3}$$

where $E^{sl}$ is the bonding energy of a surface atom with neighboring atoms in liquid. Here we assume that the number of nearest neighbors in the liquid and in the solid is the same. This will be true if the liquid is the melt of a solid or a liquid solution based on the same element. From (2) and (3) we obtain:

$$E^{sl} = E^{ss}\left(1 - \frac{\gamma_{sl}}{\gamma_{sv}}\right) \quad (4)$$

Let us compare the change in the Gibbs free energy for two cases: 1) an additional atom adheres to a surface of solid gold under the liquid and remains under the liquid; 2) an additional atom adheres to a surface of solid gold under the liquid but is brought out of the liquid. In the first case, the additional atom may increase the number of (s-l) bonds to a value $n_{sl}$. If the atom adheres to the ledge or step, this number will be smaller than in the case of ideal surface. The adherence will cause the following change in the Gibbs free energy:

$$\Delta g_1 = \Delta \mu_{ls} + \Delta E_1 \quad (5),$$

where $\Delta \mu_{ls}$ is the difference of chemical potentials of a gold atom in a bulk solid and liquid, $\Delta E_1 = n_{sl}(E^{ss} - E^{sl})$ is the change in surface energy related to the adhered atom.

In the second case, the Gibbs free energy change will be the following:

$$\Delta g_2 = \Delta \mu_{ls} + \Delta E_2 \quad (6),$$

where $\Delta E_2 = n_{ss}E^{ss} - n'_{sl}(E^{ss} - E^{sl})$ is the corresponding change in the surface energy, $n_{ss}$ is the number of new broken (s-s) bonds generated by the additional atom and $n'_{sl}$ is the number of "closed" (s-l) bonds. The difference between these two energies is given by:

$$\Delta g_2 - \Delta g_1 = \Delta E_2 - \Delta E_1 = (n_{ss} - n_{sl} - n_{sl})E^{ss} + (n_{sl} + n_{sl})E^{sl} \quad (7)$$

In the FCC gold lattice $z_b = 12$. At the ideal (111) surface the atom has $z_s = 9$ nearest neighbors. If an additional Au atom adheres to this surface, it may have 3 nearest bonds in the case of the ideal surface, 6 bonds if it adheres to the ledge, and 9 bonds if it adheres to the step. In the limit case, when the energy change $\Delta E_1$ is maximal and the $\Delta E_2$ is minimal: $n_{sl} = 6$, $n_{ss} = 3$, $n'_{sl} = 3$, the energy difference (7) is minimal. Combined with relation (4) it is given by:

$$\Delta g_2 - \Delta g_1 = 9E^{sl} - 6E^{ss} = 3E^{sl}\left(\frac{\gamma_{sv} - 3\gamma_{sl}}{\gamma_{sv} - \gamma_{sl}}\right) \quad (8)$$

As can be seen, this difference is positive for $$\gamma_{sl} < \frac{1}{3}\gamma_{sv}.$$

Applying the values of gold surface energies, $$\gamma_{sv} = 1.283 \frac{J}{m^2}, \gamma_{sl} = 0.187 \frac{J}{m^2}$$

(Armstrong et al., 2012, Jian et al., 2002), it may be concluded that adherence of the gold atoms from the liquid to the solid/liquid interface is more favorable than adherence to the facets entering from the liquid to a vapor.

Study 2. Preparation of Metal Nanoporous Single Crystal Micron Particles

Nanoporous gold has a high interest for applications such as catalysis (Ding et al., 2004; Zielasek et al., 2006), sensors (Hieda et al., 2004), actuators (Kramer et al., 2004) and electrochemical electrodes (Land et al., 2011) due to its very high surface area. Nanoporous gold has a very high strength, as strong as bulk Au (Biener et al., 2006). One of the most common ways to receive nanoporous gold is by using dealloying of Au—Ag alloy by selective removal of the Ag by using a corrosive environment, such as $HNO_3$ solution (Forty, 1979; Hodge et al., 2005). The nanoporous gold prepared by dealloying has a nano-crystalline structure (Hodge et al., 2005). In previous research works it was shown that grain boundaries in thin film of gold enhance the electrical resistivity of the gold due to grain-boundary scattering of the electrons (De Vries, 1987; Zhang et al., 2006; Wang et al., 2011). Therefore, relatively to porous polycrystalline gold, the conductivity of porous single crystal will be significantly higher.

Materials and Methods

Sample Preparation:

$SiO_2$ (100 nm) was grown on (001) Si wafers by thermal oxidation at 1100° C. The oxide layer was used as a diffusion barrier for the preventing of Si migration from the wafer Gold and Germanium films (99.999% pure, Sigma Aldrich) were evaporated onto the $SiO_2$ substrate in an e-beam-equipped Airco Temescal FC-1800 evaporating system under a high vacuum of $10^{-7}$ Torr, at room temperature, yielding normal deposition rate of 8 Ås$^{-1}$. The thicknesses of the gold and germanium films were 150 nm and 78 nm, respectively. Thermal annealing was performed at 650° C. for 5 min in a MILA-5000, ULVAC-RICO RTA, in an ambient flow of Ar—$H_2$ (99.999%, 150 sccm) with heating rate of 10° C.s$^{-1}$. Cooling rate was approximately 1° C.s$^{-1}$ Wet etching of the samples was performed by immersing the samples in a solution of $NH_4OH:H_2O_2$ (1:25% vol) for 7 min, followed by rinsing in DI water and then in ethanol. Cross section samples were obtained using a Strata 400 STEM dual-beam focused ion beam (FIB) field emission scanning electron microscope. Ar ion milling was then used for final thinning and cleaning of the surface utilizing the Gentle Mill 3HI, TechnoOrg Linda. Ion milling was done at 17° milling angle with anode voltage of 0.35 kV.

Sample Characterization.

Surface imaging was performed using Zeiss Ultra plus HRSEM, combined with EDS. Cross section micrographs were obtained using a Strata 400 STEM dual-beam FIB field emission scanning electron microscope. HRTEM diffraction was obtained utilizing Titan 80-300 KeV FEG-S/TEM. The single crystal was characterized by nano-focus beam X-ray analysis at the ID13, ESRF, Grenoble, France. The sample was rotated from −45° to 45°, with 1° intervals. After each interval the sample was scanned with a 200×150 nm focused beam, of wavelength 0.83189 Å.

Results

Figure 10A:
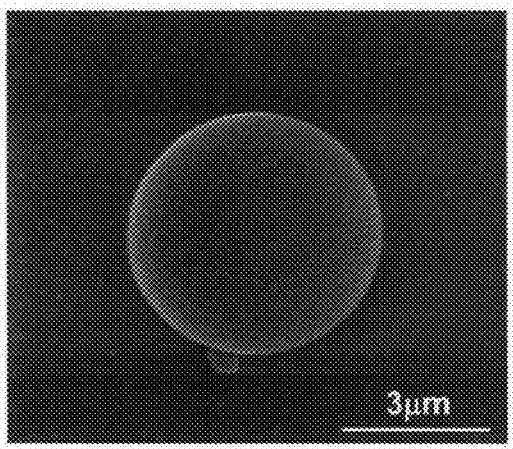
FIGS. 10A-10C show (10A) HRSEM micrograph of a droplet of eutectic gold after wet etching, top view; (10B) micrograph of a cross section of the droplet shown in 10A, obtained by FIB, revealing eutectic microstructure of the gold; and (10C) HRSEM micrograph of the porous microstructure of the gold obtained after etching the Ge.
Figure 10B:
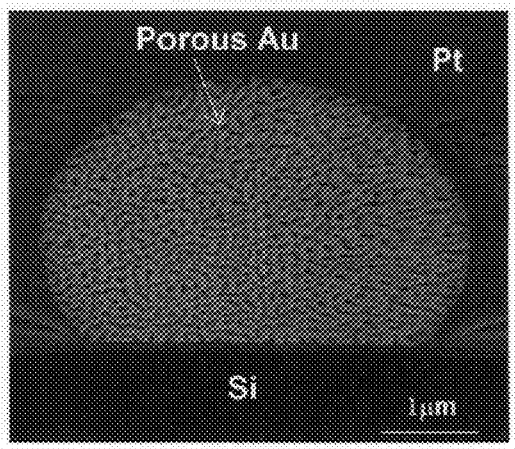
Figure 10C:
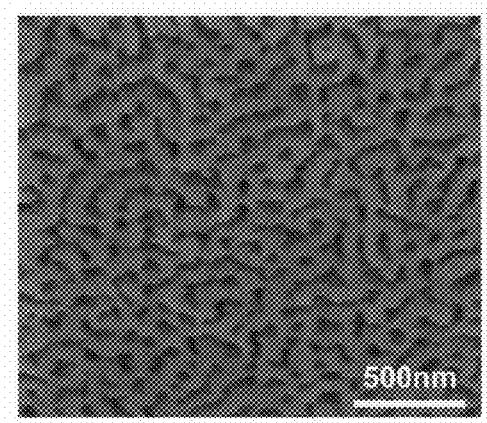

Evaporated two layer thin film thickness was chosen to suit the eutectic ratio, which is 28 at % Ge in the Au—Ge system (Okamoto and Massalski, 1984). This way annealing above the eutectic temperature led to melting of the thin films and to formation of eutectic melt. By choosing the $SiO_2$ substrate we enabled the formation of droplets of this melt through the dewetting process. Cooling below the eutectic temperature revealed solidification of the eutectic liquid into a eutectic-like solid structure. Wet etching of the samples in order to remove the germanium revealed droplets of gold as seen in FIG. 10A EDS examination of the microstructure confirmed that the Ge was fully removed during the etching (Ge concentration in the eutectic-like structure before the etching was ~14 at %, while after the etching it was near zero; relatively high amount of C and O contamination was found on the surface; and 5-7 at % of Si was found in each spectrum, probably due to $S_1$ contamination from the wafer during the FIB milling, see Table 1). FIB was utilized to obtain a cross section of the droplets and provided a closer look on the microstructure of the gold inside the droplet (FIGS. 10B-C).

TABLE 1

EDS examination of the eutectic microstructure before and after Ge etching

| at % | C | O | Si | Ge | Au |
|---|---|---|---|---|---|
| Before Ge etching | 20.37 | 15.87 | 5.33 | 13.68 | 44.75 |
| After Ge etching | 21.37 | 14.88 | 5.95 | 0.37 | 57.43 |

Figure 11A:
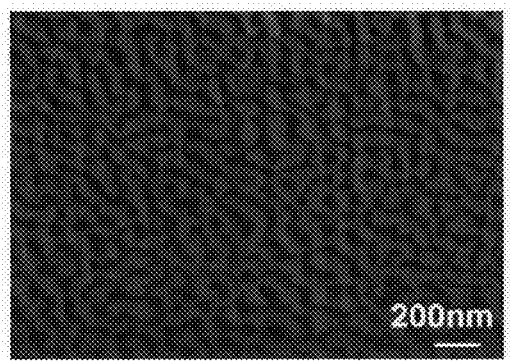
FIGS. 11A-11B show HRSEM micrograph of a FIB cross section of the eutectic microstructure for 35° $Cs^{-1}$ (11A) and 35° $Cmm^{-1}$ (11B).
Figure 11B:
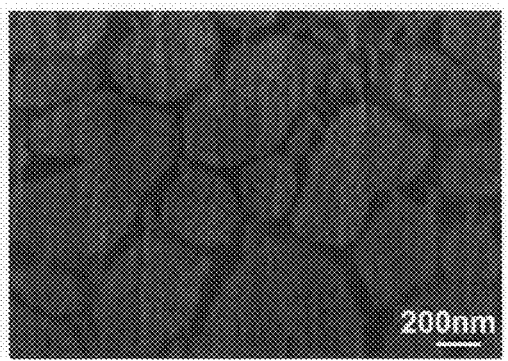

By altering the cooling rate of the samples, different micro- and nano-structures could be achieved (FIG. 11). The approximate size of the structural units in the solid droplet after the cooling with the rate 35° C.s$^{-1}$ was about 60 nm and 40 nm for gold and germanium, respectively (FIG. 11A). For slow cooling (35° Cmin$^{-1}$) the approximate sizes of the gold and the germanium units were about 300 and 70 nm, respectively (FIG. 11B).

HRTEM microscopy was performed on a thin cross section of a droplet, prepared utilizing the FIB. STEM micrograph of the sample cross section is presented in FIG. 12A. By performing selective area diffraction from an area with a diameter of approximately 4 μm, in the center of the droplet (which is the main part of the droplet) (FIG. 12B), we were able to observe a single crystal diffraction pattern that could be fully indexed within the gold structure (FIG. 12C). This indicates that the gold in the eutectic-like structure was solidified into a single crystal.

Figure 13A:
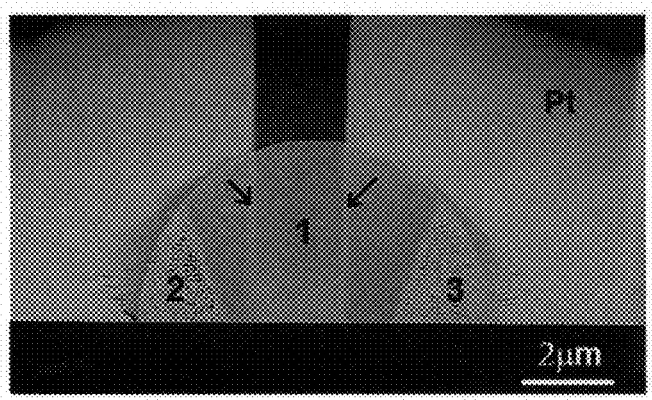
FIGS. 13A-13B show (13A) STEM micrograph of the droplet cross section, covered with Pt for protection during the sample preparation by FIB. Area 1 is the gold single crystal (previously described in Koifman Khristosov et al., 2014); and areas 2 and 3 are the single crystal gold porous microstructure, with the same orientation as in area 1. The lines (marked with small arrows) are due to milling of the single crystal area to thinner lamella for better diffraction of the single crystal (area 1). (13B) Diffractions taken from areas 1-3 (panels 1-3, respectively) at 13A, with similar orientations, could be fully indexed within the gold structure (zone axis, Z.A., [121]).
Figure 13B:
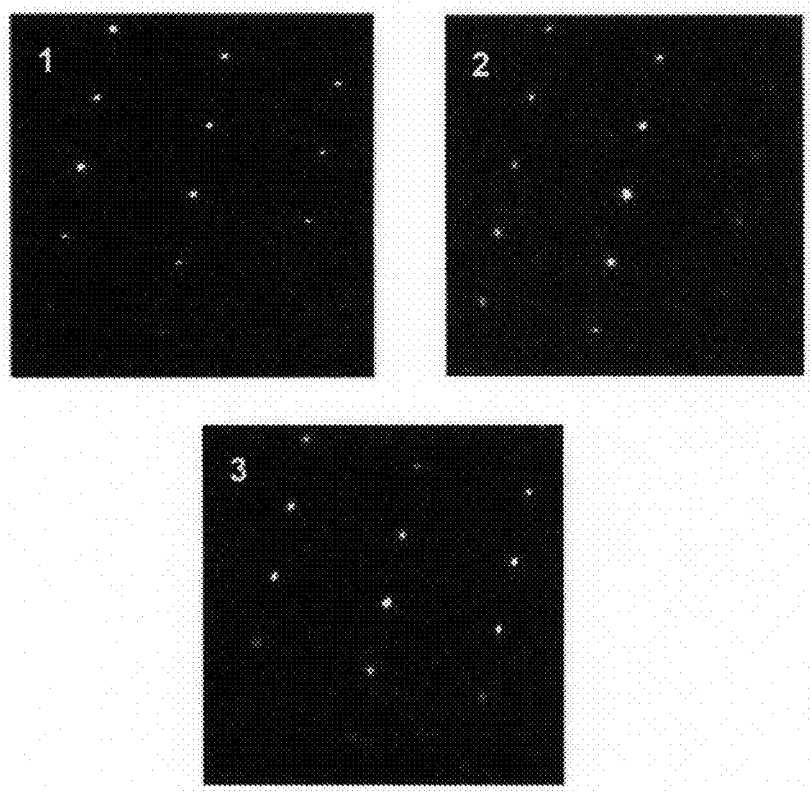

By changing the initial thin film thickness of the Au and Ge during the evaporation, hypoeutectic concentration of the melt can be achieved (Koifman Khristosov et al., 2014). In this way a droplet with gold single crystal and a eutectic structure wrapping the gold was created. After etching the Ge, a cross section of the droplet was examined utilizing HRTEM (FIG. 13A). By performing selective area diffraction from an area with a diameter of 0.5 μm in different parts of the droplets, we were able to observe a single crystal diffraction pattern that could be fully indexed within the gold structure. Identical electron diffraction patterns were obtained from different locations of the droplet cross section. The diffraction patterns were taken from the gold single crystal in the center (marked as 1), and from both gold porous regions on the left and the right side of the single crystal (marked as 2 and 3) (FIG. 13B). From those results we can conclude that all three areas have the same orientation, and this indicates that the gold in the eutectic-like structure was solidified into a single crystal as a continuation of the micron-sized single crystal in the center of the droplet.

Figure 14A:
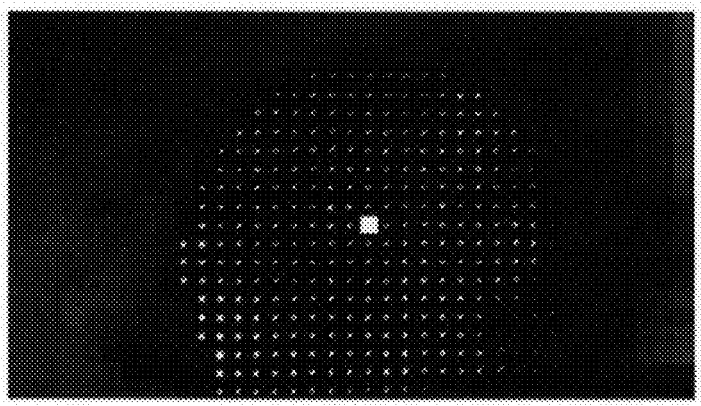
FIGS. 14A-14E show (14A) reflection map for {200} planes of sample shown on FIG. 12; (14B) average of diffractions from the drop area; (14C) diffraction from the center of the drop, marked with a square on 14A; (14D) azimuthally regrouped central diffraction, and (14E) rocking curve for the {200} planes reflection.
Figure 14B:
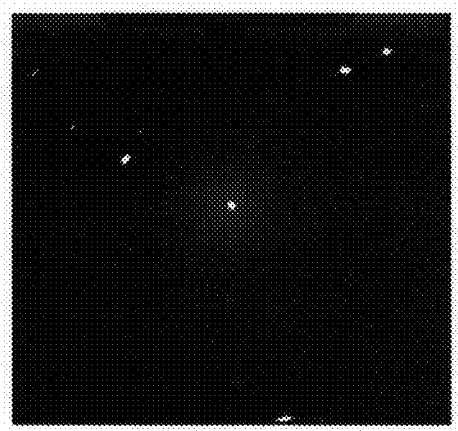
Figure 14C:
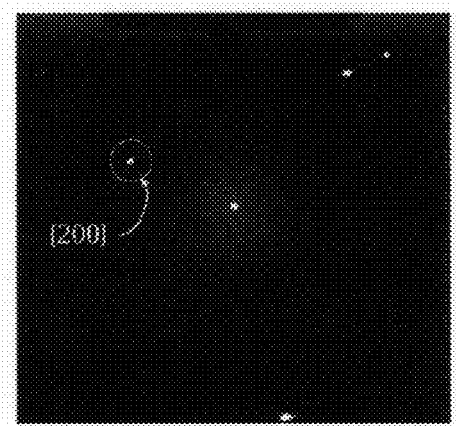
Figure 14D:
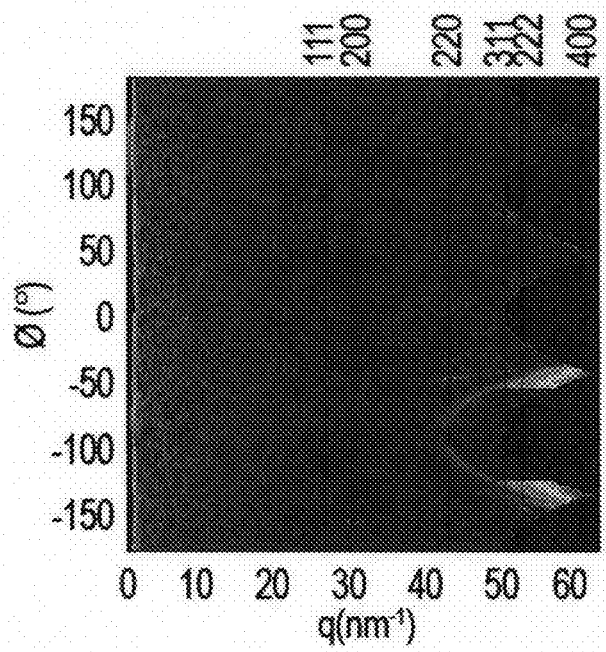
Figure 14E:
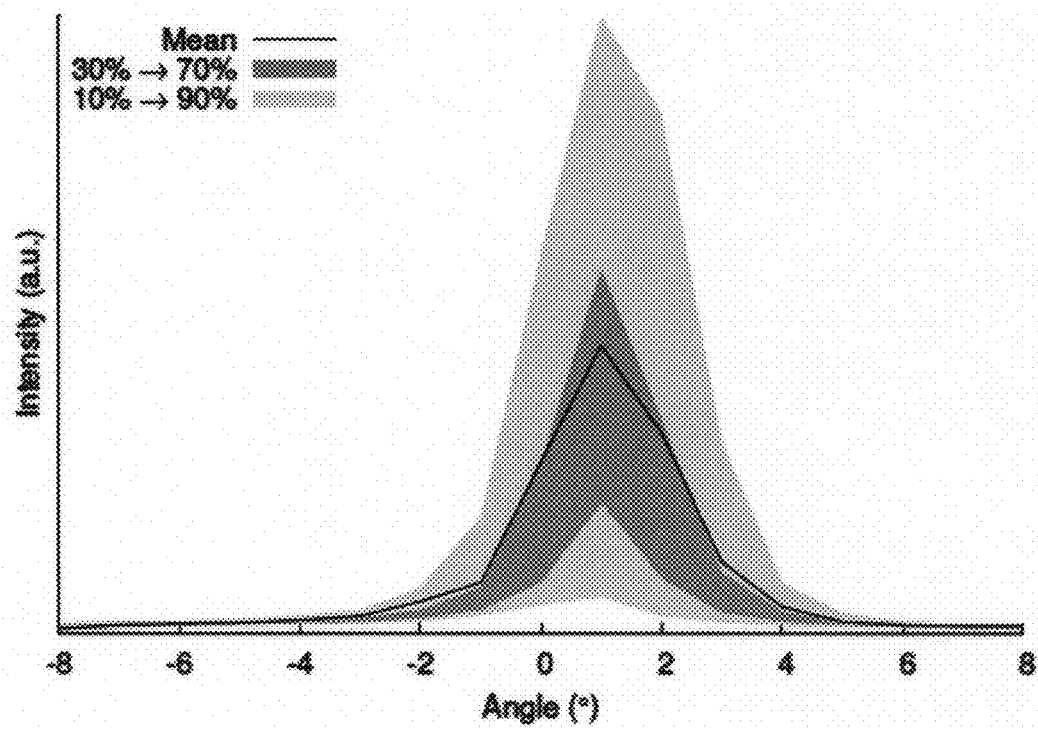
Figure 15A:
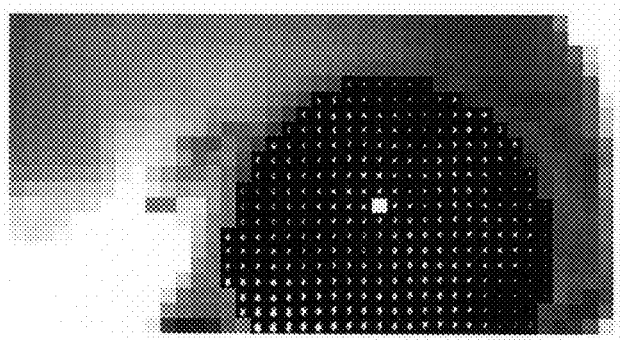
FIGS. 15A-15E show (15A) reflection map for {220} planes of sample shown on FIG. 13; (15B) average of diffractions from the drop area; (15C) diffraction from the center of the drop, marked with a square on 15A; (15D) azimuthally regrouped central diffraction, and (15E) rocking curve for the {220} planes reflection FIG. 16 schematically shows crystallization front of Au—Ge eutectic structure growing as separate germanium channels in the single crystal gold matrix.
Figure 15B:
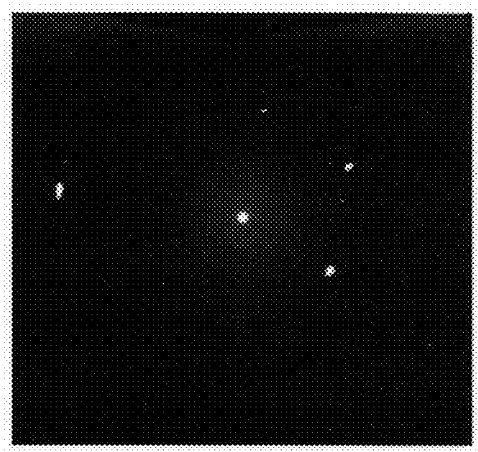
Figure 15C:
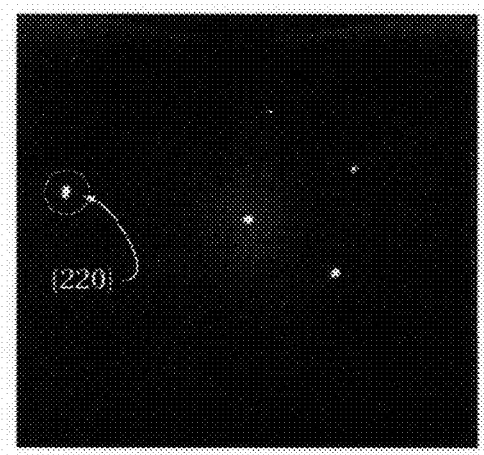
Figure 15D:
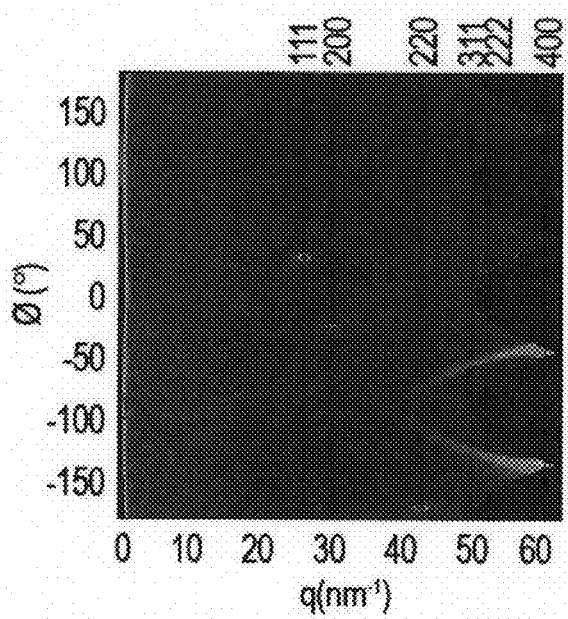
Figure 15E:
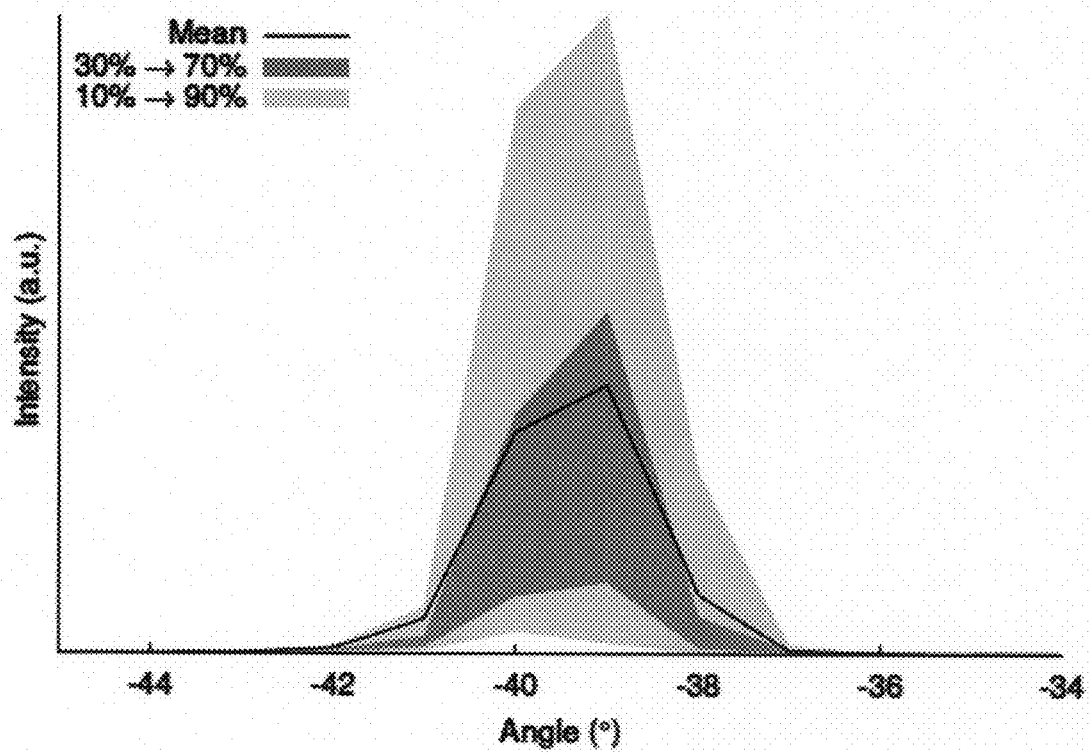

To obtain additional proof that the porous gold was a single crystal we further used sub-micron scanning synchrotron diffractometry (ID13, ESRF, Grenoble, France) on a FIB-sectioned crystal of gold. The same droplet cross section that was investigated utilizing HRTEM (FIG. 12) was scanned and revealed diffraction pattern from all parts of the droplet (FIG. 14). FIG. 14A shows a map of a single reflection ({200} planes, 0° rotation). The same reflection occurs throughout the drop at nearly the same coordinates, with only some variations in intensity FIG. 14B shows an average of all the diffractions from the drop area, and a single diffraction from the middle of the drop is shown on FIG. 14C. From these images it is evident, that the major reflections do not shift in their position throughout the drop. FIGS. 14D-E represent the azimuthally regrouped central diffraction with markings for gold crystallographic planes, and rocking curve for the same reflection. The mean intensity over the drop as well as the 10, 30 70 and 90% are shown. Results for {220} planes are shown in FIG. 15. These two latter experiments provided conclusive proof that the curved gold crystals were indeed single crystals.

The surface area of the porous Au was further estimated by analyzing HRSEM micrographs of the cross section. High resolution micrographs of the eutectic microstructure were taken and analyzed using ANALYSIS software. For surface area calculations we assumed that the microstructure of the eutectic phase is a rod-like. Therefore, calculating the surface area of the gold can be done by measuring the length of the surface on a cross section, and then multiplying by the length of the rod. This calculation revealed a surface area ~1.5 m$^2$gr$^{-1}$ of gold.

Discussion

HRTEM and synchrotron investigations revealed that the porous gold structure, both in eutectic and hypoeutectic droplets, is a single crystal. This result revealed continuous growth of a single gold crystal during formation of the eutectic-like two phase structure during the solidification.

In the case of the hypoeutectic concentration of the melt, droplet consisted of a gold single crystal in the center and a two-phase eutectic structure which wraps the crystal. Electron diffraction patterns (FIG. 13) indicate that the large gold single crystal grown during the cooling above the eutectic temperature could induce the crystallization of the gold inside the eutectic structure as its own continuation.

In the case of a fully eutectic structure, the volume ratio $V_{Au}/V_{Ge}=1.92$ makes possible continuous growth of gold crystal throughout the whole droplet, accompanied by repeated nucleation and growth of rod-like germanium crystal channels surrounded by gold matrix.

Let us consider crystallization process in a eutectic system Au—Ge. Normal crystallization of non-equilibrium eutectic liquid starts usually with heterohenious nucleation of one solid phase, most likely Au in our case, at the liquid/substrate interface. After that, the adjacent liquid is substantially enriched by Ge providing heterogeneous and epitaxial (if possible) nucleation of Ge crystal at the surface of this Au crystal. Formation is governed by the free energy gain due to undercooling below eutectic temperature, $\Delta T=(T_{eut}-T)$, when atoms are transferring from liquid to the crystal:

$$\Delta G_{tr}=(T_{eut}-T)\Delta S_{tr} \quad (1),$$

where $\Delta S_{tr}$ is the entropy change in transformation L(eutectic)→Au(s)+Ge(s), and the extra energy is needed to create the solid-liquid and Au(s)/Ge(s) interfaces. The epitaxial growth of Ge on Au is possible with the following crystallographic orientation relationships (Sayed and Buriak, 2010); Au(111)[11$\bar{2}$]//Ge(111)[11$\bar{2}$] and Au($\bar{1}\bar{1}$1)[11$\bar{2}$]//Ge(111)[11$\bar{2}$] which may provide relatively low interface energy. Growth of the eutectic structure is controlled by volume diffusion in the liquid in front of the freezing solid/liquid interface. The growth rate can be evaluated according to the simple model suggested by Turnbull (1955)

$$V = kD\frac{\Delta X}{\lambda} = kD\frac{\Delta X_0}{\lambda}\left(1 - \frac{\lambda^*}{\lambda}\right), \quad (2)$$

where D is the diffusion coefficient in liquid, $\Delta X$ is the composition difference in the liquid above the freezing interface across the lamella spacing $\lambda$, and is the function of undercooling $\Delta T$, $\Delta X_0$ is the composition difference for $\lambda \to \infty$, k–1 is a geometry dependent coefficient, $\lambda'$ is the critical lamella spacing defined by Zener (1946)

$$\lambda^* = \frac{2\gamma_{\alpha\beta}v_{mol}}{\Delta G_{tr}} = \frac{2\gamma_{\alpha\beta}v_{mol}}{\Delta T \Delta S_{tr}}, \quad (3)$$

where $\gamma_{\alpha\beta}$ is solid/solid (Au/Ge) interface energy and $v_{mol}$ is the liquid molar volume. Using the transformation entropy value for Au—Ge system (Wang et al., 2009) $\Delta S_{tr}$=23.9 Jmol$^{-1}\cdot$K$^{-1}$, and assuming $\gamma_{\alpha\beta}$=(0.2÷0.4) Jm$^{-2}$ and $\Delta T$=(10÷20)K, one can estimate from eq. (3) the value of critical width of lamellae: $\lambda'$=(8÷32) nm, which are comparable with the half of the observed lamella spacing (70÷100) nm. The relatively small supercoolings are attributed to the heterogeneous character of nucleation. These supercoolings correspond to a composition difference in the couple zone of Au/Ge phase diagram (Wang et al., 2009) $\Delta X_0$=0.01÷0.02 The self-diffusion coefficient in the liquid gold was found from viscosity experiments at high temperatures (Ofte, 1967) in the range of $2.02\cdot 10^9$ to $3.35\cdot 10^{-9}$ m$^2$s$^{-1}$ between 1063° C. and 1364° C. with activation energy $E_a$=0.316 eV. One can evaluate the diffusion coefficient in the undercooled eutectic liquid by extrapolation of these values to low temperatures as D=D$_0$ exp(-E$_a$/k$_B$T) with D$_0$=3.1·10$^{-8}$ m$^2$s$^{-1}$ that gives ~8.5·10$^{-11}$ m$^2$s$^{-1}$ for the eutectic temperature. Now we may estimate the growth rate and the time of full crystallization of the eutectic structure. The growth rate is evaluated as V=(10÷30) µms$^{-1}$ and the total crystallization time in the droplets of (2÷5) µm size is $\tau_c$=R$_d$/V=(0.07÷0.5) s, where R$_d$ is the droplet size.

A more sophisticated theory of steady-state eutectic growth has been developed by Jackson and Hunt (1966) and then modified by several authors (Trivedi et al., 1987; Kurz and Trivedi, 1991, Karma, 1994). The estimations based on this theory are presented in "The steady-state eutectic growth velocity" section hereinafter. According to Jackson and Hunt's theory evaluations, the values of freezing rates, V=(30÷60) µms$^{-1}$, are slightly higher (and the total crystallization times are lower) than those obtained from the Turnbull's model (Turnbull, 1955).

The rate of heterogeneous nucleation of gold crystals, presumably at the substrate/liquid interface, can be deduced on the basis of the classical kinetic theory (Kelton, 1991; Debenedetti, 1996):

$$J_{ss}=J_0\exp(-W^*/kT) \quad (4),$$

where W* is the height of the heterogeneous nucleation barrier, J$_0$ is pre-exponential factor. As shown in the "Heterogeneous nucleation rate in the Au—Ge eutectics" section hereinafter, for the reasonable material parameters, the pre-exponential factor can be evaluated as $J_0\approx(4\div6)\cdot 10^{20}$ s$^{-1}$ µm$^{-3}$ and to the moment when the first stable nucleus appears, the heterogeneous nucleation rate in the droplet reaches the values $$J_{ss}(t_1) = J_0 \Delta V_d e^{-y_1^2} \approx \frac{2y_1^3 \alpha}{B'}$$

nuclei per second that gives for the cooling rate $\alpha$=1° s$^{-1}$ (used in the most of present experiments) about (0.8÷1.0) nuclei per second. The average time between two first nucleation events, $$\Delta t_{12} \approx \frac{B'}{\alpha} \frac{\ln 2}{2y_1^3},$$

being compared with the time of full crystallization of the droplet, $\tau_c$, allows to formulate a criterion for appearance of a monocrystal porous structure described in the previous sections:

$$\chi = \frac{\Delta t_{12}}{\tau_c} = \frac{VB}{R_d \alpha} \frac{\ln 2}{2y_1^3} \geq 1. \quad (5)$$

For typical values of parameters (Table 3): B'=700° C., y$_1$=6.5, and $$\chi = \frac{0.88\ V}{R_d \alpha (°\ C./s)}$$

For droplets with radii $R_d \leq 10$ µm and cooling rates $\leq 1°$ C.s$^{-1}$, with V=(30÷50) µms$^{-1}$, formation of Au—Ge eutectics with the monocrystal gold matrix seems to be highly probable. On the other hand, for faster cooling, for example, with the rate $\alpha$=35° C.s$^{-1}$, formation of such structure is unlikely. In other words, for the cooling rates ~1° C.s$^{-1}$, the second nucleus appears after the first one, in average, after (0.7÷0.9) s, and this period is long enough that provides the full crystallization of the (2÷10) µm droplets before the second nucleation event. At the same time, for droplets with radii R≥20 µm and/or high cooling rates $\alpha \geq 10°$ C.s$^{-1}$, several nuclei can appear during crystallization.

The times of full crystallization process in the investigated micron size droplets were apparently substantially smaller than the average period between two subsequent events of nucleation of gold crystals front the eutectic melt, which can explain why the gold matrix of the eutectic structure was formed as a single crystal.

Figure 16:
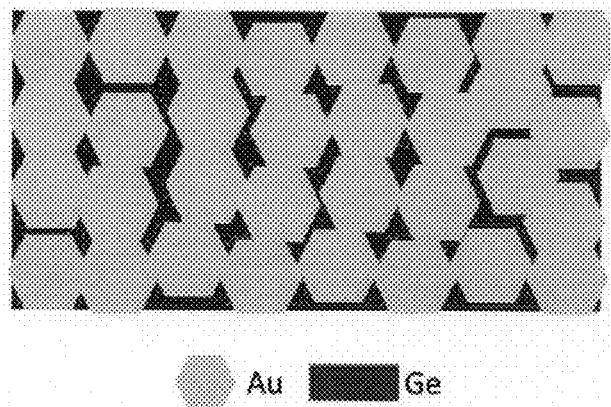

Despite of the complicative shape of the eutectic structure, it can be understood as a structure formed by separate Ge crystals wrapped with the Au matrix. Low energy coherent interfaces between Au and Ge crystals correspond to {111} planes of both crystals. The Ge crystals nucleate on the {111} faces of Au octahedrons with special orientations relative to Au <11$\bar{2}$> directions. The angles between these directions at different faces of truncated octahedron and the substrate (which is parallel to one of the {111} planes of the octahedron) are 48.2°, 70.5° and 80.4° (or, correspondingly, 99.6°, 109.5° and 131.8°). The different slopes of Ge channels to the substrate (in addition to the channels parallel to the substrate) (FIGS. 12-13) can be interpreted as projections of several favorite growth directions corresponding to the angles between different <112> directions of the gold monocrystal. Additional channels, with intermediate slopes, form during eutectic growth to maintain lamella spacing when the liquid/eutectics transformation surface increases. The single crystal Au matrix can be imagined as partly overlapped truncated octahedrons, whereas Ge crystals bridge the gaps between them and grow as separate channels from the bottom to the top of the droplet. Schematic crystallization front of such a structure is shown in FIG. 16. The regions of Ge have the shapes similar to those observed in our experiments (FIGS. 10-12).

The Steady-State Eutectic Growth Velocity

According to the Jackson and Hunt's theory (Jackson and Hunt, 1966; Trivedi et al., 1987; Kurz and Trivedi, 1991; Karma, 1994), the steady-state growth of lamellar or rod eutectic structure is described by the following relationship between velocity V, structure spacing λ and diffusion coefficient in liquid phase D:

$$\lambda^2 V = \frac{Df(1-f)a^L}{C_0 P(f,p)}, \text{ where}$$ (A1)

$$a^L = 2\left[\frac{\Gamma_\alpha \sin\theta_\alpha}{fm_\alpha} + \frac{\Gamma_\beta \sin\theta_\beta}{(1-f)m_\beta}\right],$$

$$C_0 = \frac{\rho_\alpha(C_\alpha - C_\alpha^0) - \rho_\beta(C_\beta^0 - C_\alpha)}{\rho_\alpha f + (1-f)\rho_\beta},$$

$C_1^0$ is the concentration in the solid phase 1 at the eutectic temperature, $\Gamma_i = \gamma'_{s/l}/\Delta S'_f$ is the Gibbs-Thomson coefficients, $\gamma'_{s/l}$ is the solid/liquid interface energies, $\Delta S'_f$ is the entropy of fusion of the phase i, m, is the slope of liquidus (defined as positive) in the α–β phase diagram corresponding to the i phase (i=α or β), $q_a$ and $q_b$ are the contact angles at the three-phase junction (Trivedi et al., 1987), which can be found from the surface tension balance:

$$\begin{cases} \gamma_{s/l}^\alpha \sin\theta_\alpha + \gamma_{s/l}^\beta \sin\theta_\beta = \gamma_{\alpha\beta} \\ \gamma_{s/l}^\alpha \cos\theta_\alpha = \gamma_{s/l}^\beta \cos\theta_\beta \end{cases},$$ (A2)

where $\gamma_{\alpha\beta}$ is the surface energy of the isotropic α/β interface. The function P(f,p) is defined as (Trivedi et al., 1987):

$$P(f, p) = \sum_{n=1}^{\infty} \frac{1}{(\pi n)^3} [\sin(\pi n f)]^2 \frac{p_n}{1+\sqrt{1+p_n^2}},$$ (A3)

where $p_n=2\pi n/p$, $p=V\lambda/2D$ is the Peclet number. For low velocities, p<<1, the case as usually assumed in the JH treatment, the function (A3) can be well approximated by the analytical expression (Kurz and Trivedi, 1991).

$P \approx 0.3251[1-0.205\exp(-24f_\alpha f_\beta)](f_\alpha f_\beta)^{1.01}.$

The physical constants (Turnbull, 1950, Dinsdale, 1991) and calculated parameters for the Au—Ge system are presented in the Table 2. As can be seen, for the eutectic structure spacing, λ=(70÷100) nm, the steady-state growth velocities are V=(30÷60) μms$^{-1}$.

TABLE 2

Physical constants and calculated parameters for the Au—Ge system

| | Units | Au/Ge | Ge | Au |
|---|---|---|---|---|
| $T_e$ | (K) | 631 | | |
| $T_f$ | (K) | | 1211.4 | 1337.33 |
| $C_e (X = X_{Ge})$ | (at. %) | 28 | | |
| $D(T_e)$ | (μm²/s) | 85 | | |
| $v_{mol}$ | (10$^{-3}$m³/mol) | 1.1 | | |
| $\gamma_{\alpha\beta}$ | (J/m²) | 0.174 | | |
| $\gamma_{s/l}^i$ | (J/m²) | | 0.145 | 0.1 |
| $f_i$ | — | | 0.31 | 0.69 |
| $\rho_i$ | (g/cm³) | | 5.3 | 19.3 |
| $\Delta S_f^i$ | (J/K · mol) | | 30.4975 | 9.3859 |
| $m_i$ | (K/at. %) | | 17 | 22 |
| $C_i^0$ | (at. %) | | 100 | 0.097 |

TABLE 2-continued

Physical constants and calculated parameters for the Au—Ge system

| | Units | Au/Ge | Ge | Au |
|---|---|---|---|---|
| $\theta_i$ | (°) | | 54.8 | 33.4 |
| $a^L$ | (10$^{-4}$ μm) | 2.5 | | |
| $C_0$ | (at. fraction) | 0.616 | | |
| P | — | 0.025 | | |
| $\lambda^2 V$ | (μm³/s) | 0.295 | | |

Heterogeneous Nucleation Rate in the Au—Ge Eutectics

The steady state nucleation rate is deduced on the basis of the classical kinetic theory (Kelton, 1991, Debenedetti, 1996) by eq. (4), where $$J_0 = \frac{bD}{d^2}(i^*)^{2/3} N_i Z,$$ (B1)

b=24 is a geometrical factor, $N_1=N_0/v_{mol}$ is the number density of molecules in the liquid, $N_0$ is the Avogadro number, $v_{mol}$ is the molar volume in liquid, $d=1/(N_1^{1/3}\sqrt{3})$ is the inter-molecular distance in liquid, i* is the number of molecules in the critical fluctuation, and Z~0.01 is the Zeldovich factor. Neglecting the temperature dependence of the Au diffusion coefficient in the liquid and assuming D=8·10$^{-11}$ m²s$^{-1}$ (as evaluated above) and using i*=ΔV*$N_1$=30÷50, where ΔV* is the critical nucleus volume, $v_{mol}$=1.1·10$^{-5}$ m³mol$^{-1}$, one can evaluate $J_0$=(4.4÷6.2)·10$^{38}$ m$^{-1}$s$^{-1}$.

The height of the heterogeneous nucleation barrier, W*, can be deduced from the CNT (Kelton, 1991; Debenedetti, 1996) or from the DIT (Gránásy, 1993) for different nucleus shapes. In the CNT the sharp interfaces with the constant interface energies are assumed. If the nucleus is considered as a solid droplet on the liquid/substrate surface with the contact angle θ, the heterogeneous nucleation barrier is the following (Kelton, 1991; Debenedetti, 1996):

$$W_{het}^{CNT} = \kappa S(\theta) \frac{(\gamma_{Au/liq})^3}{\Delta g_0},$$ (B2)

where $\Delta g_0$ is the volumetric free energy change due to the liquid to solid transformation. $\gamma_{Au/liq}$ is the solid/liquid interface energy.

$$S(\theta) = (2 - 3\cos\theta + \cos^3\theta)/4, \kappa = \frac{16\pi}{3}.$$

This barrier can be substantially lower than one for the homogeneous nucleation for θ<90°.

The DIT relies on the assumptions that bulk properties exist at least at the center of critical fluctuations and that the distance between the surfaces of zero excess enthalpy and zero excess entropy is independent of cluster size (Gránásy, 1993). The height of the homogeneous nucleation barrier for a droplet nucleus in the DIT approach is written as $$W_{hom}^{DIT} = \kappa \delta^3 \Delta g_0 \varphi(\eta)$$ (B3).

where δ is the characteristic interface thickness, $\varphi=2(1+q)\eta^{-3}-(3+2q)\eta^{-2}+\eta^{-1}$, $q=\sqrt{1-\eta}$, $\eta=\Delta g_0/\Delta h_0$. $\Delta h_0$ is the volumetric enthalpy difference between the solid and liquid. For the heterogeneous nucleation the additional factor $S(\theta)$ should be added in (B3).

The interface energy defined in the DIT as $\gamma_{eff}=-\delta\Delta g_0(\varphi/4)^{1/3}$ is temperature dependent through $\Delta g_0$ and $\eta$. For equilibrium conditions, $$T = T_f: W_{het}^{DIT} = \kappa S(\theta)\frac{(\gamma_\infty)^3}{(\Delta g_0)^2},$$

where $\gamma_\infty=-\delta\Delta h_0$. Baring in mind that the interface energies (Turnbull, 1950) have been determined for certain experimentally found undercooling temperatures, $T_u$, the parameter $\delta$ can be found as $\delta=\gamma_{exp}\Delta g_0(T_u)[\varphi(T_u)/4]^{1/3}$. For gold $T_u=1107K$ (Turnbull, 1950) that gives $\delta_{Au}\approx0.13$ nm and $\gamma_\infty=0.145$ Jm$^{-2}$; for germanium $T_u=1004K$, $\delta_{Ge}\approx0.06$ nm and $\gamma_\infty=0.199$ Jm$^{-2}$. For eutectic temperature it gives $\gamma_{Au}(631K)=0.1$ Jm$^{-2}$, $\gamma_{Ge}(631K)=0.145$ Jm$^{-2}$, the values used in the present calculations (Table 2)

The values of $\Delta g_0$ and $\eta=\Delta g_0/\Delta h_0$ for crystallization of gold from eutectic Au—Ge melt should be used in the expressions (B2) or (B3). The free energy change for the reaction $L(X_{eut}) \to L'(X_L) + Au$:

$$\Delta G = \frac{X_L - X_{eut}}{X_L}\Delta g_f^{Au} - T\left[S_L^{conf}(X_{eut}) - S_L^{conf}(X_L)\right] + \Delta g^E(X_{eut}, X_L), \quad (B4)$$

where $\Delta g_f^{Au}$ is the free energy of fusion of Au, $S_L^{conf}(X_{eut})$ and $S_L^{conf}(X_L)$ are the configuration entropies in the liquid at eutectic and liquidus concentrations, $\Delta g^E(X_{eut}, X_L)$ is the excess free energy change in the liquid due to the transformation. The first term in (B4) is responsible for nucleation of a gold crystal, while the two others—for supersaturation of melt with Ge that then provides nucleation of a Ge crystal. Using the first term as the driving force for the initial liquid to solid Au transformation, one can write:

$$\Delta g_0 = \frac{X_L - X_{eut}}{X_L}\Delta g_f^{Au}\frac{\Delta T}{m_{Au}X_{eut}+\Delta T}\Delta g_f^{Au} \equiv \varphi(\Delta T)\Delta g_f^{Au}, \quad (B5)$$

The time $t_l$ required for heterogeneous nucleation of a first nucleus inside a droplet can be found by integration of the nucleation rate (4) with time:

$$\Delta V_d \int_0^{t_1} J_0 \exp\left(-\frac{W^*}{kT}\right)dt = 1, \quad (B6)$$

where $\Delta V_d$ is the droplet's volume appropriate for heterogeneous nucleation. For a droplet with a bottom radius r, the volume appropriated for heterogeneous nucleation $\Delta V_d \sim \pi r^2 h$ (h is the near-substrate layer thickness); if, for example, r=2 µm, h=1 nm: $\Delta V_d \approx 0.013$ µm$^3$. Since the nucleation occurs in a narrow temperature interval (Gránásy, 1993), one can neglect by the change of diffusion coefficient during the ending and assume T=const in the exponent's denominator, while the undercooling $\Delta T$ has to be considered as the time dependent parameter: $\Delta T = T_{eut} - T = \alpha t$, where $\alpha$ is the cooling rate. With these simplifications, integration results in the following expression:

$$\bar{A}_{-1} = \left[\frac{1}{y_1}e^{-y_1^2} - \sqrt{\pi}\, erfc(y_1)\right] \equiv \psi(y_1) \quad (B7)$$

where $y_1 = \frac{B}{\alpha t_1}$, $\bar{A} = \Delta V_d J_0 B'/\alpha$, $$B' = \frac{[\kappa S(\theta)\gamma_{Au/liq}^3]^{1/2} m_{Au} X_{eut}}{\Delta S_l^{Au}(T_l - T_{eut})\sqrt{kT}} \cong Const,$$

Figure 17A:
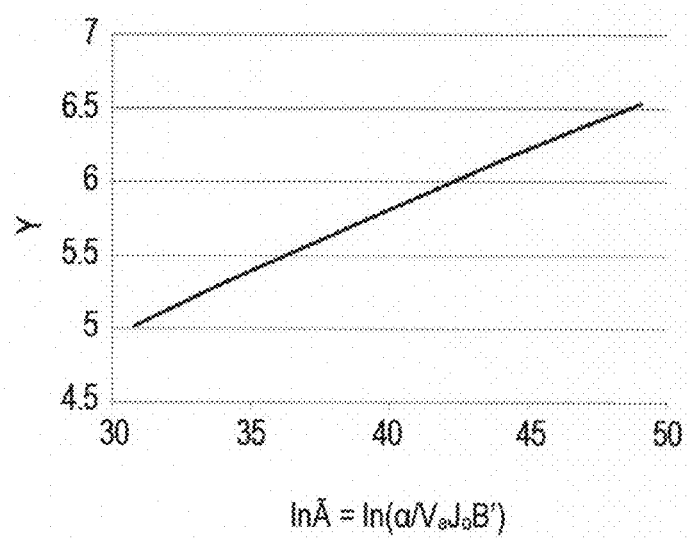
FIGS. 17A-17B show the solution of eq. (B7) in Study 2
Figure 17B:
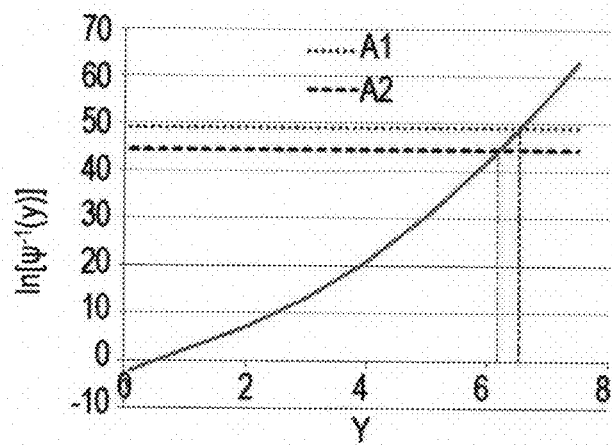

Approximate expression for the function $\psi(y_1)\approx e^{-y_1^2}/2y_1^3$ can be used for $y_1 \geq 6$. Numerical solution of eq. (B7) is illustrated in FIG. 17. As can be seen, the change of the product $\bar{A}$ for two orders of value results in variation of $y_1$ for only ~5.4%. Using the values of parameters for Au (Table 2), one can evaluate the value of $$B' \approx 1580 \cdot S^{\frac{1}{2}}(\theta) (°\text{C.})$$

and the undercooling value as $\Delta T = \alpha t_1 = B'/y_1$. Maximum experimental values of undercooling for nucleation in metal drops (up to 50 µm diameter) are ~0.18 $T_f$ (Turnbull, 1950) Using $T_{eut}=631K$ for Au—Ge system as a melting temperature one can evaluate $\Delta T_m=114°$ C. The values $y_1=(6.2 \div 6.5)$ (see below) correspond to B'=(707÷740)° C. and $S(\theta)\approx0.2$ ($\theta\approx65°$). For such values of B' the first nucleus appears allot $t_1\approx3.5$ s for the cooling rate $\alpha=35°$ C.s$^{-1}$ and $t_1\approx3.5$ min for $\alpha=35°$ C.min$^{-1}$.

The average period between the first and the second nucleation events can be evaluated from equation: $\psi(y_2)=2\psi(y_1)$ The exact numerical solution gives $y_2=6.130$ for $y_1=6.185$ ($\bar{A}=2\cdot10^{19}$) and $y_2=6.483$ for $y_1=6.535$ ($\bar{A}=2\cdot10^{21}$) (FIG. 17). The approximate solution $y_1-y_2\approx\ln 2/(2y_1)$ gives approximately the same values with the error ~0.02%. Then the period between two first nucleation events:

$$t_2 - t_1 \equiv \Delta t_{12} = \frac{B'}{\alpha}\frac{(y_1-y_2)}{y_1 y_2} = \frac{B'}{\alpha}\frac{\ln 2}{2y_1^3} = (1.2 \div 1.5)\cdot 10^{-3}\left(\frac{B'}{\alpha}\right). \quad (B8)$$

For determined values of B' the period $\Delta t_{12}$ is evaluated as $\Delta t_{12}=(2.4\div3.2)10^{-2}$ s for $\alpha=35°$ C.s$^{-1}$ and $\Delta t_{12}=(1.4\div1.9)$s for $\alpha=35°$ C.min$^{-1}$. Several reasonable sets of calculated parameters are given in Table 3.

TABLE 3

Different sets of the calculated parameters for the Au—Ge system

|  | $J_0$ $10^{20}$ µm$^{-3}$s$^{-1}$ | $\Delta V_d$ µm$^3$ | B' ° C. | $\alpha$ Cs$^{-1}$ | A $10^{20}$ | $y_1$ | $y_2$ | $R_d$ µm | V µm/s | $\Delta t_{12}$ s | $\tau = R_d/V$ s |
|---|---|---|---|---|---|---|---|---|---|---|---|
| I | 4 | 0.01 | 175 | 35 | 0.2 | 6.185 | 6.13 | 5 | 30 | 0.007 | 0.17 |
| II | 4 | 0.01 | 500 | 1 | 20 | 6.535 | 6.483 | 5 | 30 | 0.61 | 0.17 |

TABLE 3-continued

Different sets of the calculated parameters for the Au—Ge system

| | $J_0$ $10^{20}$ μm$^{-3}$s$^{-1}$ | $\Delta V_d$ μm$^3$ | B' °C. | α Cs$^{-1}$ | A $10^{20}$ | $y_1$ | $y_2$ | $R_d$ μm | V μm/s | $\Delta t_{12}$ s | $\tau = R_d/V$ s |
|---|---|---|---|---|---|---|---|---|---|---|---|
| III | 5 | 0.017 | 700 | 1 | 60 | 6.616 | 6.563 | 6.5 | 50 | 0.84 | 0.13 |
| IV | 6 | 0.04 | 700 | 0.5 | 336 | 6.741 | 6.691 | 10 | 30 | 1.55 | 0.3 |

REFERENCES

Adhikari, H.; Marshall, A. F.; Chidsey, C. E.; McIntyre, P. C. Germanium nanowire epitaxy shape and orientation control *Nano Lett.* 2006, 6, 318-323

Aizenberg, J.; Muller, D. A., Grazul, J. L. Hamann, D. Direct fabrication of large micropatterned single crystals *Science* 2003, 299, 1205-1208

Armstrong, J. N., Gande, E. M.; Vinti, J. W.; Hua, S. Z.; Chopra, H. D., Emergence of physical properties mapped in a two-component system. *arXiv preprint arXiv:* 1205.0488 2012

Audran, S.; Vaillant, J.; Farys, V.; Hirigoyen, F., Huss, E.; Mortini, B.; Cowache, C.; Berthier, L.; Mortini, E.; Fantuz, J.; Arnaud O.; Depoyan, L.; Sundermann, F., Baron, C., Reynard, J-P., Grayscale lithography process study applied to zero-gap microlenses for sub-2 μm CMOS image sensors, *Proc. of SPIE* 2010, 7639, 763910-763911

Barnard, A. S.; Lin., X.; Curtiss, L. A., Equilibrium morphology of face-centered cubic gold nanoparticles>3 nm and the shape changes induced by temperature. *J. Phys. Chem. B* 2005, 109, 24465-24472

Biener, J.; Hodge, A. M.; Hayes, J. R., Volkert, C. A. Zepeda-Ruiz, L. A.; Hamza, A. V. Abraham, F. F., Size effects on the mechanical behavior of nanoporous Au *Nano Letters,* 2006, 6 (10), 2379-2382

Borukhin, S.; Pokroy. B., Formation and elimination of surface nanodefects on ultraflat metal surfaces produced by template stripping. *Langmuir* 2011, 27, 13415-13419

Carey, J.; Ong, L.; Silva, S., Formation of low-temperature self-organized nanoscale nickel metal islands. *Nanotechnology* 2003, 14, 1223

Cheng, J. Y.; Ross, C.; Chan, V. H.; Thomas, E. L.; Lammertink, R. G.; Vancso, G. J., Formation of a cobalt magnetic dot array via block copolymer lithography. *Adv. Mater.* 2001, 13, 1174-1178

Cölfen, H., Single crystals with complex form via amorphous precursors. *Angew. Chem. Int. Ed.* 2008, 47, 2351-2353

Corso. M.; Schiller, F.; Fernández, L.; Cordón, J.; Ortega, J., Electronic states in faceted Au (111) studied with curved crystal surfaces. *J. Phys.: Condens. Matter* 2009, 21, 353001

Debenedetti, P. G. Metastable liquids: concepts and principles 1996: Princeton University Press De Vries, J., Resistivity of thin Au films as a function of grain diameter and temperature *Journal of Physics F Metal Physics* 1987, 17 (9), 1945

Ding, Y., Kim, Y. J.; Erlebacher, J. Nanoporous gold leaf "Ancient technology"/advanced material *Advanced Materials* 2004, 16 (21), 1897-1900

Dinsdale, A. T., SGTE data for pure elements *Calphad,* 1991, 15 (4), 317-425

Donnay, G; Pawson, D. L., X-ray Diffraction Studies of Echinoderm Plates. *Science* (New York, N.Y.) 1969, 166 (3909), 1147

Eustathopoulos, N.; Drevet, B., Determination of the nature of metal-oxide interfacial interactions from sessile drop data. *Mater. Sci. Eng.: A* 1998, 249, 176-183

Forty, A., Corrosion micromorphology of noble metal alloys and depletion gilding. 1979

Fratzl, P.; Fischer, F. D.; Svoboda, J.; Aizenberg, J., A Kinetic model of the transformation of a micropatterned amorphous precursor into a porous single crystal. *Acta Biomater.* 2010, 6, 1001-1005

Fritzsche, W., Taton, T. A., Metal nanoparticles as labels for heterogeneous, chip-based DNA detection *Nanotechnology* 2003, 14, R63

Gránásy, L., Diffuse interface theory of nucleation *Journal of non-crystalline solids,* 1993, 162 (3), 301-303

Guan, Y., Pearce, R., Melechko, A., Hensley, D.; Simpson, M., Rack, P., Pulsed laser dewetting of nickel catalyst for carbon nanofiber growth. *Nanotechnology* 2008, 19, 235604

Hieda, M., Hieda, Mitsunori; Garcia, R.; Dixon, M.; Daniel, T.; Allara, D.; Chan, M. H. W., Ultrasensitive quartz crystal microbalance with porous gold electrodes. *Applied physics letters* 2004, 84 (4), 628-630

Hodge, A. M.; Biener, J.; Hsiung, L. M.; Wang, Y. M.; Hamza, A. V.; Satcher Jr. J., Monolithic nanocrystalline Au fabricated by the compaction of nanoscale foam. *Journal of materials research* 2005, 20 (3), 554-557

Jackson, K. A.; Hunt, J. D., The dendrite-eutectic transition. *Trans. AIME* 1966, 236, 1129-1142

Jian, Z.; Kuribayashi, K.; Jie, W., Solid-liquid interface energy of metals at melting point and undercooled state *Mater. Trans.* 2002, 43, 721-726

Karma, A., Phase-field model of eutectic growth *Physical Review E* 1994, 49 (3), 2245

Kelton, K., Crystal nucleation in liquids and glasses. *Solid state physics* 1991, 45, 75-177

Klemmer, T.; Liu, C.; Shukla, N.; Wu, X.; Weller, D.; Tanase, M.; Laughlin, D.; Soffa, W., Combined reactions associated with L1$_0$ ordering. *J. Magn. Magn. Mater.* 2003, 266, 79-87

Kodambaka, S.; Tersoff, J.; Reuter, M., Ross, F. Germanium nanowire growth below the eutectic temperature. *Science* 2007, 316, 729-732

Koifman Khristosov, M.; Kabalah-Amitai, L., Burghammer, M.; Katsman, A.; Pokroy, B., Formation of curved micrometer-sized single crystals. *ACS nano* 2014, 8 (5), 4747-4753

Kojima, Y.; Kato, T., Nanoparticle formation in Au thin films by electron-beam-induced dewetting, *Nanotechnology* 2008, 19, 255605

Kossel, W.; Loeck, V.; Voges, H., Die richtungsverteilung der in einem kristall entstandenen charakteristischen röntgenstrahlung. *Z. Phys. A: Hadrons Nucl.* 1935, 94, 139-144

Kramer, D.; Viswanath, R. N.; Weissmüller, J., Surface-stress induced macroscopic bending of nanoporous gold cantilevers. *Nano Letters* 2004, 4 (5), 793-796

Kurz, W.; Trivedi, R., Eutectic growth under rapid solidification conditions. *Metallurgical Transactions A,* 1991, 22 (12), 3051-3057

Kwon, S.-H.; Choe, H. J.; Lee, H.-C.; Chung. C.-W.; Lee, J.-J., Mechanism of solid-state plasma-induced dewetting for formation of copper and gold nanoparticles *J. Nanosci. Nanotechnol.* 2013, 13, 6109-6114

Lang, X.; Hirata, A.; Fujita, T.; Chen, M., Nanoporous metal/oxide hybrid electrodes for electrochemical supercapacitors. *Nature Nanotechnology* 2011, 6 (4), 232-236

Lee, J.-H.; Choi, W.-S.; Lee, K.-H.; Yoon, J.-B., A simple and effective fabrication method for various 3d microstructures: backside 3d diffuser lithography *J. Micromech. Microeng.* 2008, 18, 125015

Lee, K.; Wagermaier, W.; Masic, A.; Kommareddy, K. P.; Bennet, M., Manjubala, I.; Lee, S.-W.; Park, S. B.; Cölfen, H.; Fratzl, P., Self-assembly of amorphous calcium carbonate microlens arrays. *Nat. Commun.* 2012, 3, 725

Maier, S. A.; Kik, P. G.; Atwater, H. A.; Meltzer, S.; Harel, E.; Koel, B. E.; Requicha, A. A., Local detection of electromagnetic energy transport below the diffraction limit in metal nanoparticle plasmon waveguides. *Nat. Mater.* 2003, 2, 229-232

Meldrum, F. C.; Ludwigs, S., Template-directed control of crystal morphologies. *Macromol. biosciBiosci.* 2007, 7, 152-162

Mitsui, K.; Handa, Y., Kajikawa, K., Optical fiber affinity biosensor based on localized surface plasmon resonance. *Appl. Phys. Lett.* 2004, 85, 4231-4233

Ofte, D., The viscosities of liquid uranium, gold and lead. *Journal of nuclear materials* 1967, 22 (1), 28-32

Oh, J.; Campbell, J. C., Thermal desorption of Ge native oxides and the loss of Ge from the surface. *J. Electron. Mater.* 2004, 33, 364-367

Okamoto H.; Massalski, T. B., *Bull. Alloy Phase Diagrams,* 5 ed.; 1984

Park, R. J., Meldrum, F. C., Synthesis of single crystals of calcite with complex morphologies, *Adv. Mater.* 2002, 14, 1167-1169

Raup, D. M., Crystallography of echinoid calcite. *The Journal of Geology* 1959, 661-674

Sangiorgi, R.; Muolo, M. L.; Chatain, D., Eustathopoulos, N., Wettability and work of adhesion of nonreactive liquid metals on silica. *J. Am. Ceram. Soc.* 1988, 71, 742-748

Sayed, S. J.; Buriak, J. M., Epitaxial growth of nanostructured gold films on germanium via galvanic displacement. *ACS applied materials & interfaces* 2010, 2 (12), 3515-3524

Sommerdijk, N. A.; Cölfen, H., Lessons from nature—biomimetic approaches to minerals with complex structures. *MRS Bull.* 2010, 35, 116-121

Tao, A. R.; Ceperley, D. P.; Sinsermsuksakul, P.; Neureuther, A. R.; Yang, P., Self-organized silver nanoparticles for three-dimensional plasmonic crystals. *Nano Lett.* 2008, 8, 4033-4038

Trivedi, R.; Magnin, P.; Kurz, W., Theory of eutectic growth under rapid solidification conditions *Acta Metallurgica* 1987, 35 (4), 971-980

Turnbull, D., Correlation of liquid-solid interfacial energies calculated from supercooling of small droplets. *The Journal of Chemical Physics,* 1950, 18 (5), 769-769

Turnbull, D., Theory of cellular precipitation. *Acta Metallurgica* 1955, 3 (1), 55-63

Vlachos, D. G.; Schmidt, L. D.; Aris, R., Kinetics of faceting of crystals in growth, etching, and equilibrium. *Phys. Rev. B* 1993, 47, 4896

Wang, J.; Leinenbach, C.; Roth, M., Thermodynamic modeling of the Au—Ge—Sn ternary system. *Journal of Alloys and Compounds,* 2009, 481 (1), 830-836

Wang, H-D.; Liu, J.-H.; Zhang, X.; Guo, Z.-Y.; Takahashi, K., Experimental study on the influences of grain boundary scattering on the charge and heat transport in gold and platinum naofilms. *Heat and Mass Transfer* 2011, 47 (8), 893-898

Weiner, S.; Sagi, I.; Addadi, L., Choosing the crystallization path less traveled. *Science* 2005, 309, 1027-1028

Weiner, S.; Addadi, L., Crystallization pathways in biomineralization. *Annu. Rev. Mater. Res.* 2011, 41, 21-40

Wucher, B.; Yue, W.; Kulak, A. N.; Meldrum, F. C. Designer crystals: single crystals with complex morphologies. *Chem. Mater.* 2007, 19, 1111-1119

Xu, R., X-ray thermal diffuse scattering and its studies of lattice dynamics. University of Illinois, 2010

Yue, W.; Kulak, A. N.; Meldrum, F. C., Growth of single crystals in structured templates. *J. Mater. Chem.* 2006, 16, 408-416

Yun, Y.; Dong, Z.; Shanov, V. N.; Docpke, A., Heineman, W. R.; Halsall, H. B.; Bhattacharya, A.; Wong, D. K.; Schulz, M. J., Fabrication and characterization of carbon nanotube array electrodes with gold nanoparticle tips. *Sen. Actuators B* 2008, 133, 208-212

Zener, C., Kinetics of the decomposition of austenite. *Trans. Ainte,* 1946, 167, 550-595

Zhang, Q. G., Cao, B. Y., Zhang, X., Fujii, M.; Takahashi, K., Influence of grain boundary scattering on the electrical and thermal conductivities of polycrystalline gold nanofilms. *Physical Review B,* 2006, 74 (13), 134109

Zielasek, V.; Jürgens, B.; Schulz, C.; Biener, J.; Biener, M. M.; Hamza, A. V.; Bäumer, M., Gold catalysts: nanoporous gold foams. *Angewandte Chemie International Edition,* 2006, 45 (48), 8241-8244

The invention claimed is:

1. A process for the preparation of micron-sized particles having a controlled curvature, said particles spread over a supporting substrate and including a single-crystal first metal wrapped in a nanoporous structure, said process comprising:
   (i) providing said substrate;
   (ii) depositing vapours of the first metal and of a second metal on a surface of said substrate, thus forming a substrate deposited with either a thin film comprising said first and second metals, or two thin films each comprising a different metal of said first and second metals, wherein said metals deposited on said substrate are selected from Au, Ag, Ge, Cu, and Pt, and the atomic percentage ratio between said first metal and said second metal is such that upon annealing said film(s), said first metal and said second metal form a eutectic melt;
   (iii) annealing said film(s) for a sufficient time period to form said eutectic melt that spontaneously dewets into micron-sized droplets spread over said substrate;
   (iv) (a) cooling said eutectic melt to room temperature, or (b) continuing the annealing of step (iii) in an environment that contains oxygen, thereby removing the second metal from said eutectic melt, to consequently grow a single crystal of the first metal, wherein according to a phase diagram of the eutectic melt, in each one of said droplets, said single crystal is grown in the confined space of said droplet, has a controlled curvature determined by the curved shape of said confining droplet and is wrapped in a two-phase eutectic microstructure comprising the first metal and the second metal;

(v) cooling the grown single crystals of the first metal wrapped in the two-phase eutectic microstructure comprising the first metal and the second metal to obtain micron-sized particles of the single-crystal first metal wrapped in a solid phase comprising said two metals; and (vi) removing the second metal from said solid phase, thereby obtaining the micron-sized particles of the single-crystal first metal wrapped in the nanoporous structure, said particles having a controlled curvature and being spread over the supporting substrate;

wherein said substrate is inert relative to said thin film(s) formed in step (ii); and the eutectic melt in step (iii) dewets within a temperature range allowing dewetting to occur prior to diffusion intermixing with said substrate and/or oxidation.

2. The process of claim 1, wherein upon continuing the annealing in step (iv) in an environment that contains oxygen, the second metal is oxidized, sublimes and is removed by evaporation of the corresponding oxide.

3. The process of claim 1, wherein upon cooling in step (v), the grown single crystals of the first metal continue growing by inducing crystallization of the first metal inside the two-phase eutectic microstructure, wherein growth of the first metal single crystal is accompanied by repeated nucleation and growth of the second metal crystal at the surface of the first metal single crystal, thereby obtaining micron-sized particles of the single crystal first metal wrapped in a solid phase comprising said two metals.

4. The process of claim 1, wherein said removal of the second metal from the solid phase in step (vi) comprises wet etching of said metal.

5. The process of claim 1, wherein said eutectic melt formed in step (iii) comprises the eutectic concentration of said two metals.

6. The process of claim 1, wherein said vapors of said first and second metals are deposited on the surface of said substrate at any sequential order or concurrently.

7. The process of claim 1, wherein the annealing in step (iii) is carried out under $N_2$, forming gas or argon atmosphere, or under vacuum.

8. The process of claim 1, wherein said substrate comprises silicon dioxide (silica), titanium dioxide (titania), magnesium oxide (magnesia), aluminium oxide (alumina), or a spinel such as $MgAl_2O_4$.

9. The process of claim 1, wherein said first and second metals are Au and Ge, or Ag and Ge, respectively.

10. The process of claim 1, wherein the shape of the micron-sized droplets formed in step (iii) is controlled by modulating the contact angle and the droplet curvature, which is affected by the surface tension.

11. The process of claim 10, wherein the contact angle and the surface tension of said micron-sized droplets is controlled by altering the oxygen partial pressure in the annealing environment.

12. The process of claim 1, further comprising the step of segregating said micron-sized particles from said supporting substrate.

* * * * *